US012712547B2

(12) United States Patent
Yang et al.

(10) Patent No.: US 12,712,547 B2
(45) Date of Patent: Aug. 18, 2026

(54) INTEGRATED CIRCUIT WITH ESD PROTECTION CIRCUIT

(71) Applicants: TAIWAN SEMICONDUCTOR MANUFACTURING COMPANY, LTD., Hsinchu (TW); TSMC China Company Limited, Shanghai (CN)

(72) Inventors: Huizhi Yang, Shanghai City (CN); Qinling Ma, Nantong City (CN); Lei Pan, Shanghai City (CN); Yaqi Ma, Shanghai City (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 452 days.

(21) Appl. No.: 18/352,004

(22) Filed: Jul. 13, 2023

(65) Prior Publication Data

US 2025/0007517 A1 Jan. 2, 2025

(30) Foreign Application Priority Data

Jun. 29, 2023 (CN) ........................ 202321684220.1

(51) Int. Cl.

| | |
|---|---|
| ***H03K 19/0175*** | (2006.01) |
| ***H02H 9/04*** | (2006.01) |
| ***H10D 89/60*** | (2025.01) |

(52) U.S. Cl.

CPC ..... *H03K 19/017545* (2013.01); *H02H 9/046* (2013.01); *H10D 89/814* (2025.01)

(58) Field of Classification Search

CPC .......... H03K 19/017545; H02H 9/046; H10D 89/814; H10D 89/811

USPC .......................................................... 361/56

See application file for complete search history.

(56) References Cited

U.S. PATENT DOCUMENTS 6,806,516 B2 * 10/2004 Negishi ............... H10D 89/601 257/175
6,898,062 B2 * 5/2005 Russ .................... H10D 62/151 361/111
7,777,548 B2 * 8/2010 Kang ................. H03K 3/35613 327/333
8,279,568 B2 * 10/2012 Stultz .................. H03K 17/063 361/87

(Continued)

*Primary Examiner* — Dharti H Patel

(74) *Attorney, Agent, or Firm* — Birch, Stewart, Kolasch & Birch, LLP

(57) ABSTRACT

An integrated circuit is provided and includes a first active region of a first conductivity type coupled to a first voltage terminal and corresponding to a first terminal of a first transistor and a first terminal of a second transistor included in an inverter of a level shifter circuit, wherein the first transistor is configured to discharge electrostatic charges to the first voltage terminal; and second and third active regions, corresponding to a third transistor, of a second conductivity type different from the first conductivity type, wherein the second active region is coupled to a second voltage terminal, and the third active region is coupled to a first terminal, different from the second voltage terminal, of the level shifter circuit. The third transistor is configured to transmit a first supply voltage from the second voltage terminal for the integrated circuit.

20 Claims, 17 Drawing Sheets

(56) References Cited

U.S. PATENT DOCUMENTS

| | | | | |
|---|---|---|---|---|
| 8,575,962 | B2 * | 11/2013 | Yang | H03K 3/356156 716/136 |
| 11,251,782 | B1 * | 2/2022 | Grad | H10D 89/921 |
| 11,901,892 | B2 * | 2/2024 | Altolaguirre | H03K 19/018521 |
| 2005/0146819 | A1 * | 7/2005 | Jiang | H03K 19/00315 361/56 |
| 2005/0219778 | A1 * | 10/2005 | Shigenari | H03K 17/08142 361/56 |
| 2005/0286187 | A1 * | 12/2005 | Liu | H10D 89/601 361/56 |
| 2006/0092587 | A1 * | 5/2006 | Czech | H10D 89/601 361/56 |
| 2007/0014061 | A1 * | 1/2007 | Chang | H02H 9/046 361/56 |
| 2009/0237139 | A1 * | 9/2009 | Kang | H03K 3/35613 327/333 |
| 2015/0062761 | A1 * | 3/2015 | Chen | H02H 9/046 327/333 |
| 2019/0097420 | A1 * | 3/2019 | Chen | H02H 9/046 |
| 2020/0035670 | A1 * | 1/2020 | Tsai | H02H 9/046 |
| 2020/0203947 | A1 * | 6/2020 | Kim | H02H 9/046 |
| 2021/0281067 | A1 * | 9/2021 | Chen | H10D 89/815 |
| 2021/0344330 | A1 * | 11/2021 | Ou | H03K 3/356 |
| 2022/0231686 | A1 * | 7/2022 | Lee | H03K 19/018521 |

* cited by examiner

40

70

1000

DESIGN HOUSE 1010

IC DESIGN LAYOUT DIAGRAM 1011

MASK HOUSE 1020

DATA PREPARATION 1021

MASK FABRICATION 1022

MASK 1023

FAB 1030

WAFER FABRICATION 1031

WAFER 1032

IC DEVICE 1040

INTEGRATED CIRCUIT WITH ESD PROTECTION CIRCUIT

CROSS REFERENCE

The present application claims priority to China Application Serial Number 202321684220.1 filed on Jun. 29, 2023, which is herein incorporated by reference in its entirety.

BACKGROUND

An ESD event produces extremely high voltages and leads to pulses of high current of a short duration that can damage integrated circuit devices. For example, gate oxide layers in transistors of the integrated circuit are broke down when ESD currents are discharged between terminals of the integrated circuit. For the purposed of efficient ESD protection, the ESD protection circuit often requires large numbers of NMOSs/PMOSs which occupy large area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
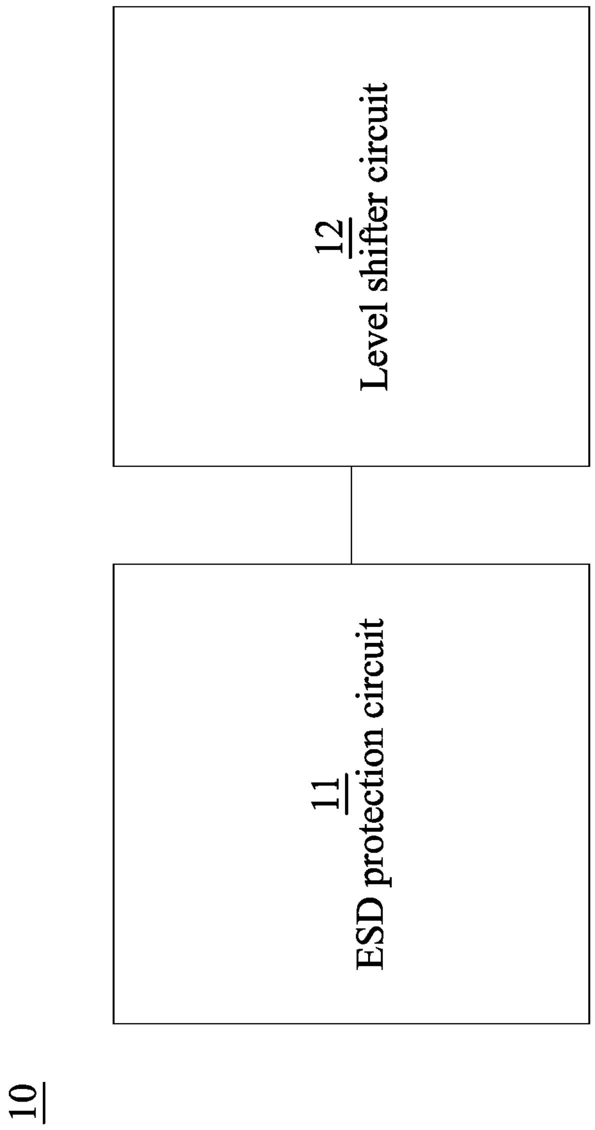
FIG. 1 is a block diagram of part of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1. FIG. 1 is a block diagram of part of an integrated circuit 10, in accordance with some embodiments. For illustration, the integrated circuit includes an electrostatic discharge (ESD) protection circuit 11 and a level shifter circuit 12. In some embodiments, the ESD protection circuit 11 is coupled to a terminal of the level shifter circuit 12 to prevent the level shifter circuit 12 being damaged in an ESD event occurring at input/output terminals, internal terminals and/or voltage terminals that are configured to provide supply voltages to the level shifter circuit 12. The level shifter circuit 12 is configured to shift a voltage swing of a signal received at the input terminal IN to correspondingly output an output signal based on the voltage provided to the level shifter circuit 12.

Figure 2A:
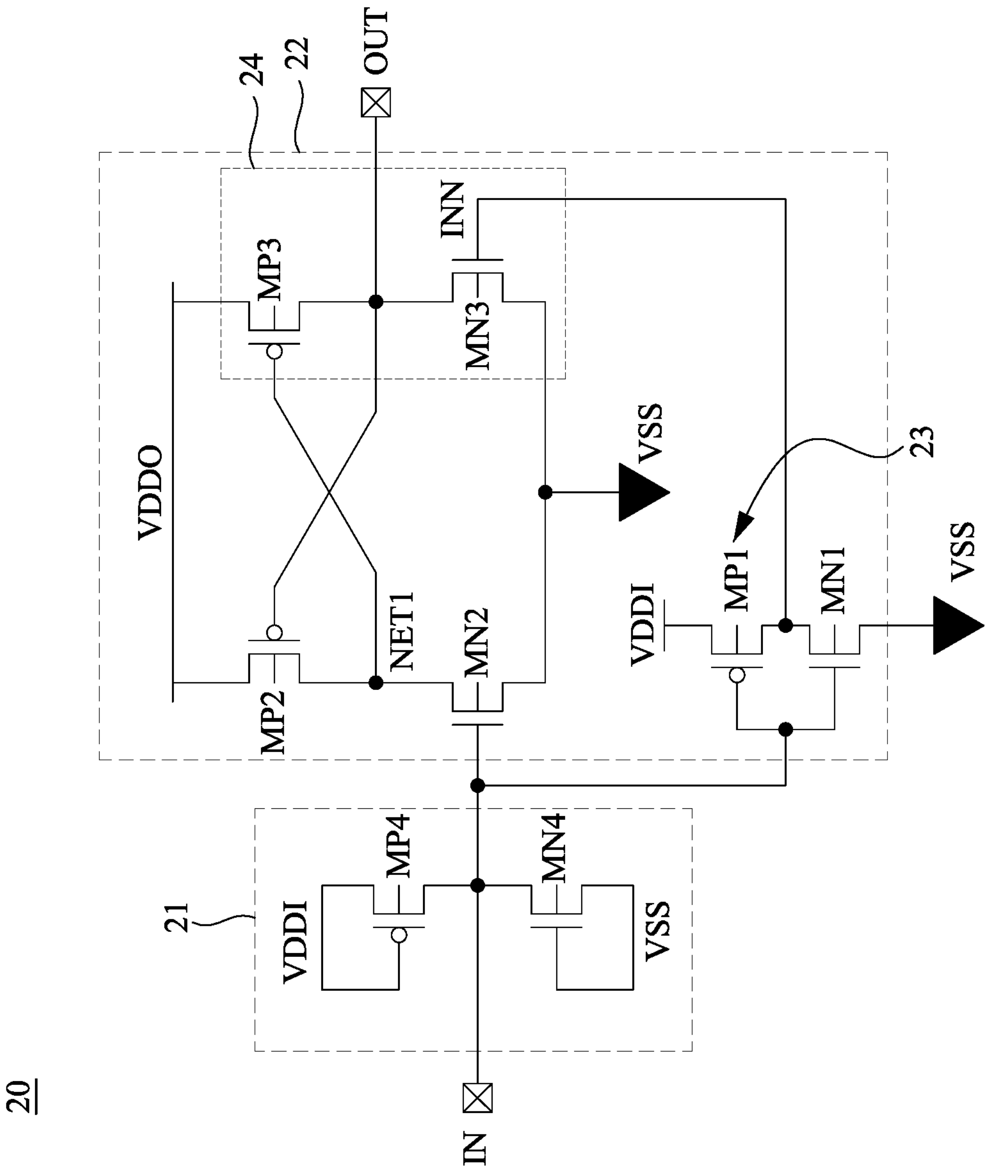
FIG. 2A is an equivalent circuit of part of an integrated circuit corresponding to the integrated circuit of FIG. 1, in accordance with some embodiments.

Reference is now made to FIG. 2A. FIG. 2A is an equivalent circuit of part of an integrated circuit 20 corresponding to the integrated circuit 10 of FIG. 1, in accordance with some embodiments. For illustration, the integrated circuit 20 includes an ESD protection circuit 21 and a level shifter circuit 22 including an inverter 23 and an output stage circuit 24. In some embodiments, the ESD protection circuit 21 and the level shifter circuit 22 are configured with respect to, for example, the ESD protection circuit 11 and the level shifter circuit 12 in FIG. 1 respectively. As shown in FIG. 2A, The ESD protection circuit 21 is coupled to an input terminal IN of the level shifter circuit 22 and configured to protect the level shifter circuit 22 from the charged device model (CDM) stress in ESD events.

For illustration, the level shifter circuit 22 includes an inverter 23 having transistors MP1 and MN1, transistors MP2 and MN2, and an output stage circuit 24 having transistors MP3 and MN3.

The transistors MN1 and MP1 are coupled in series between voltage terminals VDDI and VSS, gates (referred to as an input of the inverter 23) thereof is coupled to the input terminal IN, the ESD protection circuit 21, and a gate of the transistor MN2, and drains (referred to as an output of the inverter 23) thereof is coupled to a gate (referred to as a terminal INN of the output stage circuit 24) of the transistor MN3.

Sources of the transistors MP2-MP3 are coupled to a voltage terminal VDDO. A drain of the transistor MP2 is coupled to a gate of the transistor MP3 at a terminal NET1. A drain of the transistor MP3 is coupled to a gate of the transistor MP2 at the output terminal OUT. Sources of the transistors MN2-MN3 are coupled to the voltage terminal VSS. A drain of the transistor MN2 is coupled to the terminal NET1. A drain of the transistor MN3 is coupled to the output terminal OUT.

The output stage circuit 24 includes transistors MP3 and MN3. Gate and source terminals of the transistor MP4 are coupled together to the voltage terminal VDDI, and a drain thereof is coupled to the input terminal IN, the gate of the transistor MN2, and the input of the inverter 23. Gate and source terminals of the transistor MN4 are coupled together to the voltage terminal VSS, and a drain thereof is coupled to the drain of the transistor MP4.

In some embodiments, supply voltages, also referred to as VDDO, VDDI, and VSS, provided from the voltage terminals VDDO, VDDI, and VSS are different from each other. Alternatively stated, the transistors MP1, MP4 and MN1, MN4 operate in a VDDI voltage domain and the transistor MP2-MP3 and the transistor MN2-MN3 operate in a VDDO voltage domain. In some embodiments, voltage levels of the supply voltages VDDI and VDDO are greater than the supply voltage VSS. In various embodiments, the voltage level of the supply voltage VDDO is the highest among the supply voltages provided to the integrated circuit 20.

In some embodiments, during an ESD event at the input terminal IN and/or the voltage terminal VDDI, the transistor MN4 is configured to discharge electrostatic charges to the voltage terminal VSS.

In some embodiments, the transistors MN1-MN4 are of N conductivity type and the transistors MP1-MP4 are of P conductivity type.

Figure 2B:
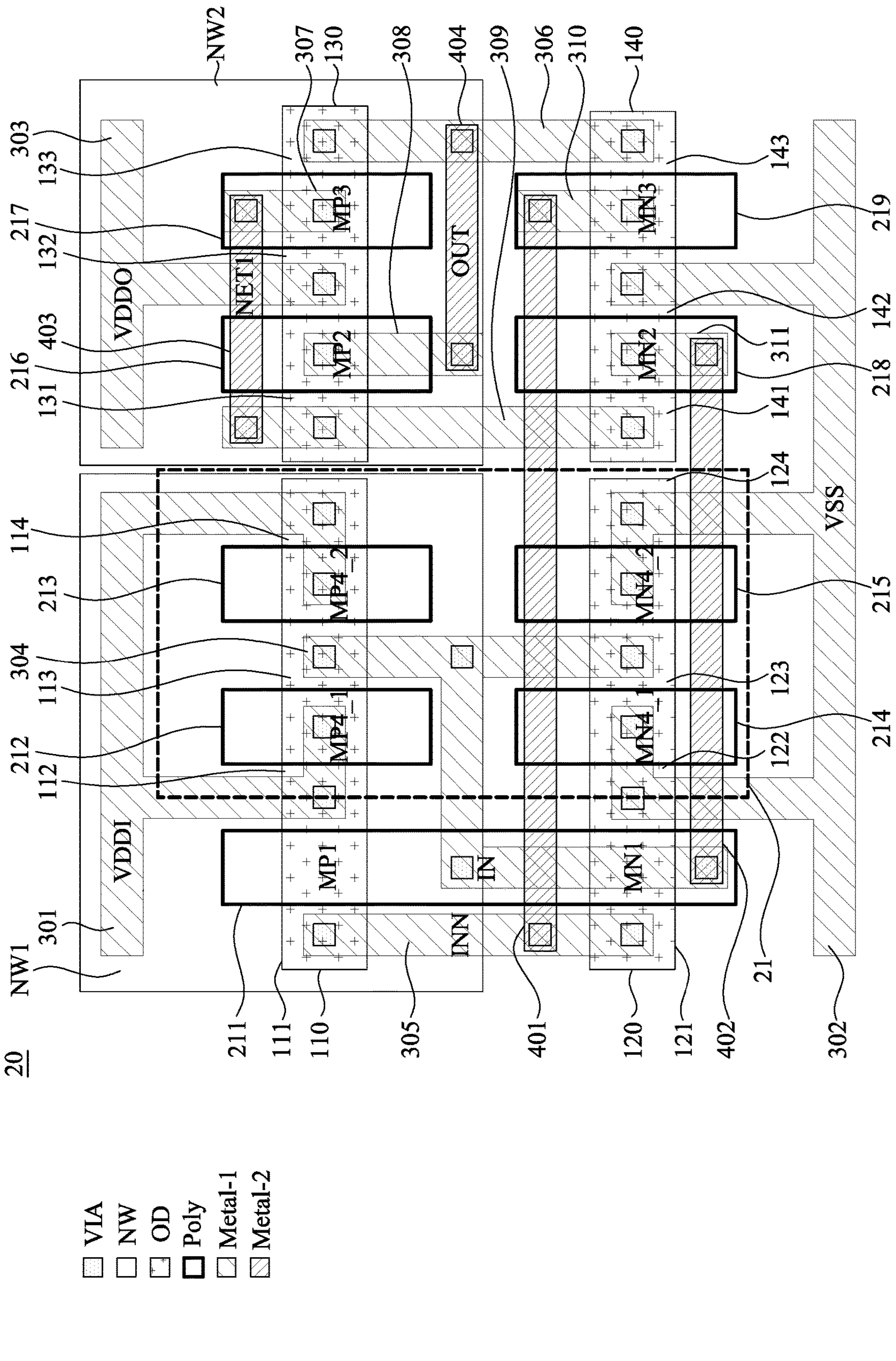
FIG. 2B is a layout diagram in a plan view of part of the integrated circuit in FIG. 2A, in accordance with some embodiments.

Reference is now made to FIG. 2B. FIG. 2B is a layout diagram in a plan view of part of the integrated circuit 20 in FIG. 2A, in accordance with some embodiments. As shown in FIG. 2B, the integrated circuit 20 includes active areas (e.g., Oxide diffusion (OD)) 110-140 in a first semiconductor layer, gates (e.g., polysilicon (POLY)) 211-219 in a second semiconductor layer above the first semiconductor layer, conductive lines (e.g., metal-one layer) 301-311 in a third semiconductor layer above the second semiconductor layer, and conductive traces (e.g., metal-two layer) 401-404 in a fourth semiconductor layer above the third semiconductor layer. The integrated circuit 20 further includes contacts VIA coupling between structures in the integrated circuit 20.

In some embodiments, the active areas 110 and 130 are doped with p-type dopants including, such as boron, indium, aluminum, gallium, or a combination thereof. The active areas 120 and 140 are doped with n-type dopants, including, such as phosphorus, arsenic, or a combination thereof. The N-wells NW1-NW2 disclosed herein are formed by doping a substrate with n-type dopants, unless mentioned otherwise. In some embodiments, the substrate includes a semiconductor material such as, but not limited to, silicon, germanium, a compound semiconductor including silicon carbide, and gallium arsenide, doped with p-type dopants.

For illustration, the active areas 110-140 extend in x direction and separately include active regions 111-114, 121-124, 131-133, and 141-143. The active area 110 is separated from the active area 130 in x direction. The active area 120 is separated from the active area 140 in x direction. Furthermore, the active areas 110-120 are disposed apart in y direction, and the active areas 130-140 are disposed apart in y direction. In some embodiments, the active regions 111-114 and 131-133 are of P conductivity type and in N wells NW1 and NW2 on a substrate of the integrated circuit 20 respectively. In various embodiments, the N wells NW1 and NW2 are different from each other. The active regions 121-124 and 141-143 on the substrate are of N conductivity type.

The gates 211-219 extend in y direction. The gate 211 crosses over the active areas 110-120. The gates 212-213 overlap the active area 110, the gates 214-215 overlap the active area 120, the gates 216-217 overlap the active area 130, and the gates 218-219 overlap the active area 140.

As shown in FIG. 2B, the active regions 111-114 and the gates 211-213 are interlaced. The active regions 121-124 and the gates 211, 214-215 are interlaced. The active regions 131-133 and the gates 216-217 are interlaced. The active regions 141-143 and the gates 218-219 are interlaced.

In some embodiments, the ESD protection circuit 21 is arranged between the inverter 23 and the output stage circuit 24 in a layout view. For example, the transistors MN1-MN2 in the level shifter circuit 22 are separated from each other in x direction and the transistors MN4, MP4 in the ESD protection circuit 21 are arranged between the transistors MN1-MN2 along x direction.

Specifically, with reference to FIGS. 1-2B, the active regions 111-112 correspond to the drain and the source of the transistor MP1, the active regions 121-122 correspond to the drain and the source of the transistor MN1, and the gate 211 corresponds to the gate of the transistors MP1 and MN1. The active regions 112 and 114 correspond to the source of the transistor MP4 (formed by two parallel-coupled transistors MP4_1 and MP4_2 in the embodiments of FIG. 2B), the active region 113 corresponds to the drain of the transistor MP4 and the gates 212-213 correspond to the gate of the transistor MP4. Similarly, the active regions 122 and 124 correspond to the source of the transistor MN4 (formed by two parallel-coupled transistors MN4_1 and MN4_2 in the embodiments of FIG. 2B), the active region 123 corresponds to the drain of the transistor MN4 and the gates 214-215 correspond to the gate of the transistor MN4. The active regions 131 and 133 correspond to the drains of the transistors MP2-MP3, and the active region 132 corresponds to the sources of the transistors MP2-MP3. The gates 216-217 correspond to the gates of the transistors MP2-MP3 respectively. The active regions 141 and 143 correspond to the drains of the transistors MN2-MN3, and the active region 142 corresponds to the sources of the transistors MN2-MN3. The gates 218-219 correspond to the gates of the transistors MN2-MN3 respectively.

As shown in FIG. 2B, regarding the transistors MP4 and MN4 in the ESD protection circuit 21, the conductive line 301 provides the voltage VDDI to the integrated circuit 20 through the active region 112, the gates 212-213, and the active region 114 that are coupled with each other together through the vias VIA. The active region 113 between the gates 212-213 is coupled to the active region 123 through the conductive line 304 extending in y direction and further coupled to the gate 211 and the gate 218 through the conductive trace 402 extending in x direction and the conductive line 311. The conductive line 302 coupled to the voltage terminal VSS is further coupled to the active regions 122, 124 and the gates 214-215.

The active regions 111 and 121 that correspond to the drains of the transistors MP1 and MN1 are coupled to each other through conductive line 305 extending in y direction. The conductive line 305 is further coupled to the terminal INN by the conductive trace 401 coupled to the gate 219 through conductive line 310.

Regarding the output stage circuit 24 and the transistors MP2 and MN2, the conductive line 303 provides the voltage VDDO to the integrated circuit 20 through the active region 132. The active region 131 is coupled to the active region 141 by the conductive line 309 and further coupled to the gate 217 through the conductive trace 403, corresponding to the terminal NET1, and the conductive line 307. The active region 133 is coupled to the active region 143 through the conductive line 306 and is further coupled to the gate 216 by the conductive line 308 and the conductive trace 404 corresponding to the output terminal OUT. The conductive line 302 is further provides the voltage VSS to the output stage circuit 24 by coupling to the active region 142.

In some approaches, the integrated circuit includes unused dummy structures in the level shifter circuit, which causes area penalty, provides none of ESD protection capability and makes the core circuit suffer from large voltage drop between gate and source terminals of the transistors coupled to the input and output terminals of the level shifter circuit. Alternatively stated, without proper protection design in the circuit, gates of the transistors coupled to the input and output pins can easily break down.

With the configuration of the present application, the voltage drop Vgs between the gate and source of transistor MN2 or transistor MN3 is reduced by 12% and there is no waste area compared to some approaches that do not have ESD protection circuitry in the integrated circuit.

Figure 3A:
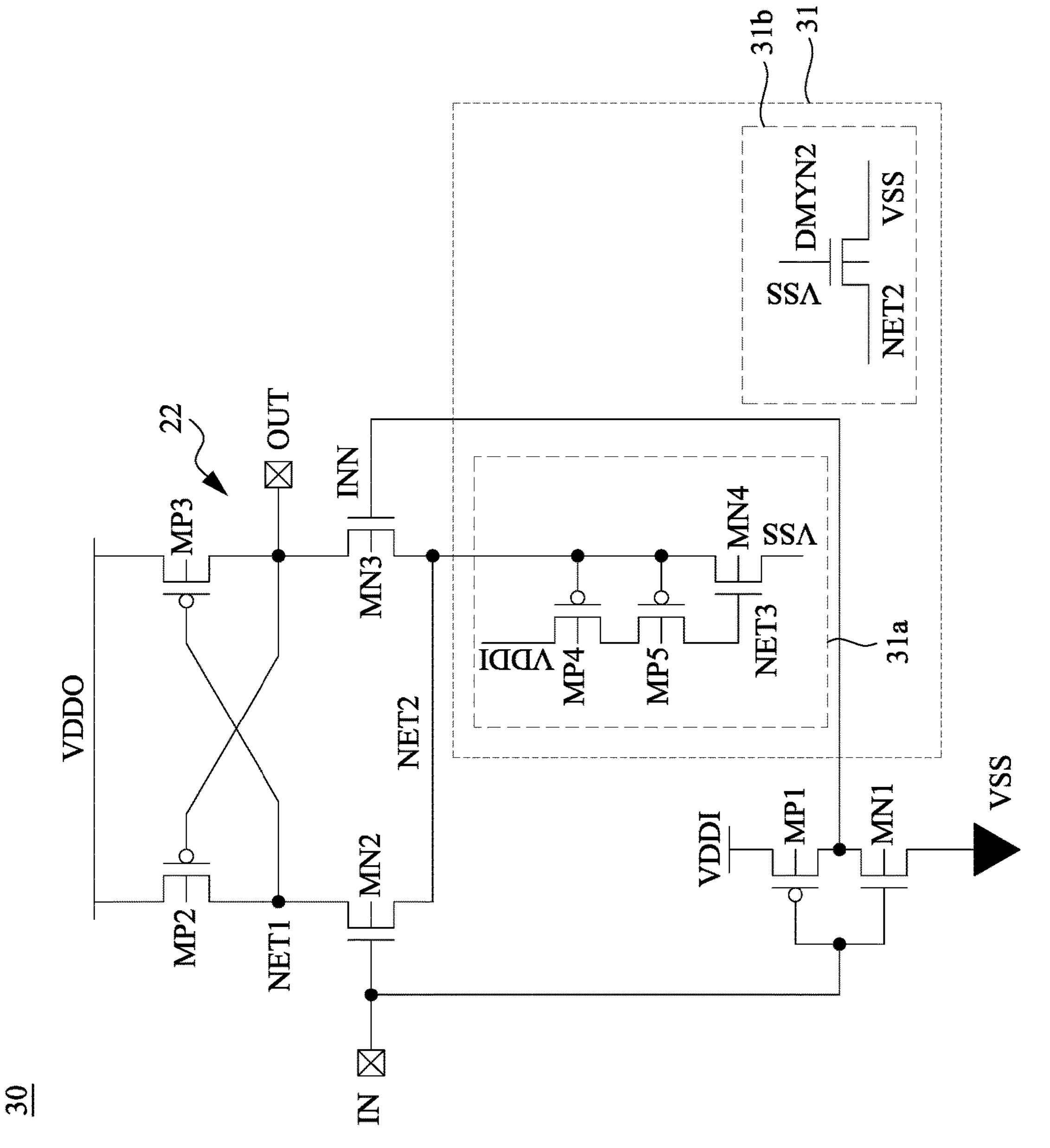
FIG. 3A is an equivalent circuit of part of an integrated circuit corresponding to the integrated circuit of FIG. 1, in accordance with various embodiment.
Figure 3B:
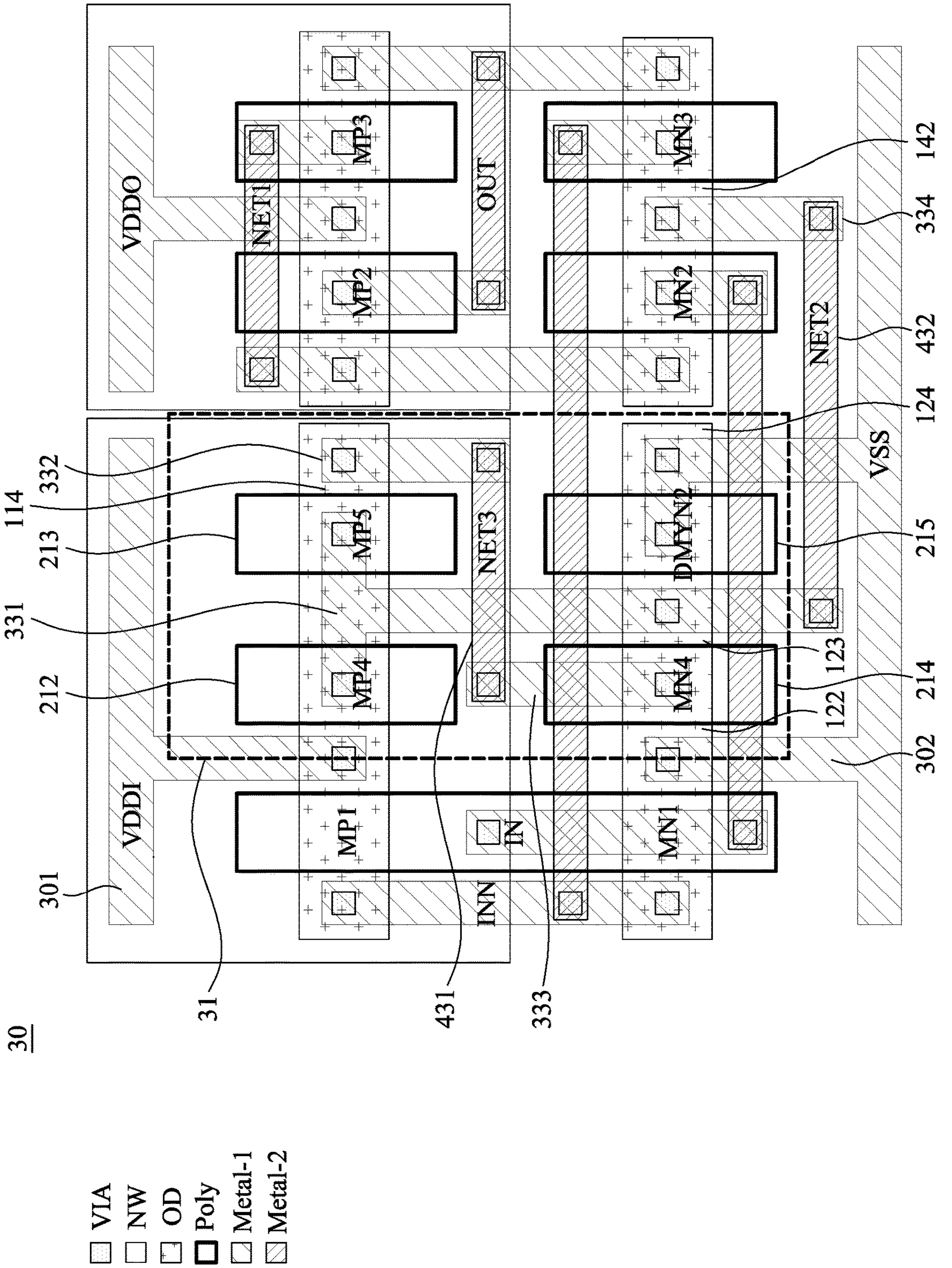
FIG. 3B is a layout diagram in a plan view of part of the integrated circuit in FIG. 3A, in accordance with some embodiments.

Reference is now made to FIGS. 3A-3B. FIG. 3A is an equivalent circuit of part of an integrated circuit 30 corresponding to the integrated circuit 10 of FIG. 1, and FIG. 3B is a layout diagram in a plan view of part of the integrated circuit 30 in FIG. 3A, in accordance with some embodiments. With respect to the embodiments of FIGS. 1-2B, like elements in FIGS. 3A-3B are designated with the same reference numbers for ease of understanding. The specific operations of similar elements, which are already discussed in detail in above paragraphs, are omitted herein for the sake of brevity. In some embodiments, the integrated circuit 30 is configured with respect to, for example, the integrated circuit 10 of FIG. 1.

For illustration, instead of having the ESD protection circuit 21, the integrated circuit 30 includes an ESD protection circuit 31. The ESD protection circuit 31 includes a tie low circuit 31*a* and a dummy circuit 31*b* that are coupled to the sources of the transistors MN2-MN3 at a terminal NET2. The transistors MP4-MP5 are coupled in series between the voltage terminal VDDI and a terminal NET3 coupled to the gate of the transistor MN4, which can sustain high voltage bias. The gates of the transistors MP4-MP5 are coupled to the drain of the transistor MN4 at the terminal NET2. The source of the transistor MN4 is coupled to the voltage terminal VSS. A transistor DMYN2 in the dummy circuit 31*b* has a first terminal coupled to the terminal NET2 and a second terminal and gate that are coupled to the voltage terminal VSS.

In some embodiments, the tie low circuit 31*a* is configured as a positive feedback circuit. For example, the transistor MN4 is slightly turned on to pull down a voltage level of the gates of the transistors MP4-MP5. Accordingly, the transistors MP4-MP5 are turned on to further fully conduct the transistor MN4. Similarly, in various embodiments, the transistors MP4-MP5 are slightly turned on to pull up a voltage level of the gate of the transistor MN4. Accordingly, the transistor MN4 is turned on to further fully conduct the transistors MP4-MP5. Based on the above, the tie low circuit 31*a* pulls down a voltage level of the terminal NET2 to the supply voltage VSS in operation. Alternatively stated, the ESD protection circuit 31 is further configured to adjust the voltage level of the terminal NET2 (referred to as an internal terminal of the level shifter circuit 22) according to the voltage at the voltage terminal VSS.

In the ESD event between the voltage terminals VDDI and VSS, a corresponding ESD current can be further discharged by the transistor MN4, protecting the internal circuit, for example, the level shifter circuit 22. Specifically, the transistor MN4 limits current and divides the voltage between the terminal NET2 and the voltage terminal VSS, and accordingly, the voltage drop Vgs of the transistor MN2 or transistor MN3 reduces, preventing the electrostatic charges accumulating at the voltage terminal VDDI being discharged at the input terminal IN to break down the gate of the transistor MN2 or at the terminal INN to break down the gate of the transistor MN3.

With the configurations of the present application, the voltage drop Vgs of the transistor MN2 or transistor MN3 efficiently decreases to 44%, compared with some approaches.

Referring to FIG. 3B, the integrated circuit 30 further includes conductive lines 331-334 and conductive traces 431-432. The conductive lines 331-334 are configured with respect to, for example, the conductive line 301-311 and the conductive traces 401-404 of FIG. 1.

In some embodiments, the gates 212-213, corresponding to the gate of the transistors MP4-MP5 of FIG. 3A, are coupled to the active region 142 corresponding to the sources of the transistors MN2-MN3 through the conductive line 331, the conductive trace 432, and the conductive line 334 and vias VIA. Specifically, a portion of the conductive line 331 extends in x direction to couple the gates 212-213, and the other portion extends in y direction to couple the active region 123 and the conductive trace 432 corresponding to the terminal NET2.

The active region 114 is coupled to the gate 214 through the conductive line 332, the conductive trace 431, and the conductive line 333. In the layout view, the conductive trace 431 is arranged between the gates 212 and 214 and between the gate 213 and 215. Alternatively stated, the conductive trace 431 is disposed between the active area 110 and the active area 120.

In some embodiments, the gate 215 corresponds to the gate of the transistor DMYN2, and the active regions 123 and 124 correspond to the second and first terminals respectively.

With the configurations of the present application, the voltage drop Vgs of the transistor MN2 or transistor MN3 efficiently decreases to about 44%, compared with some approaches.

Figure 3C:
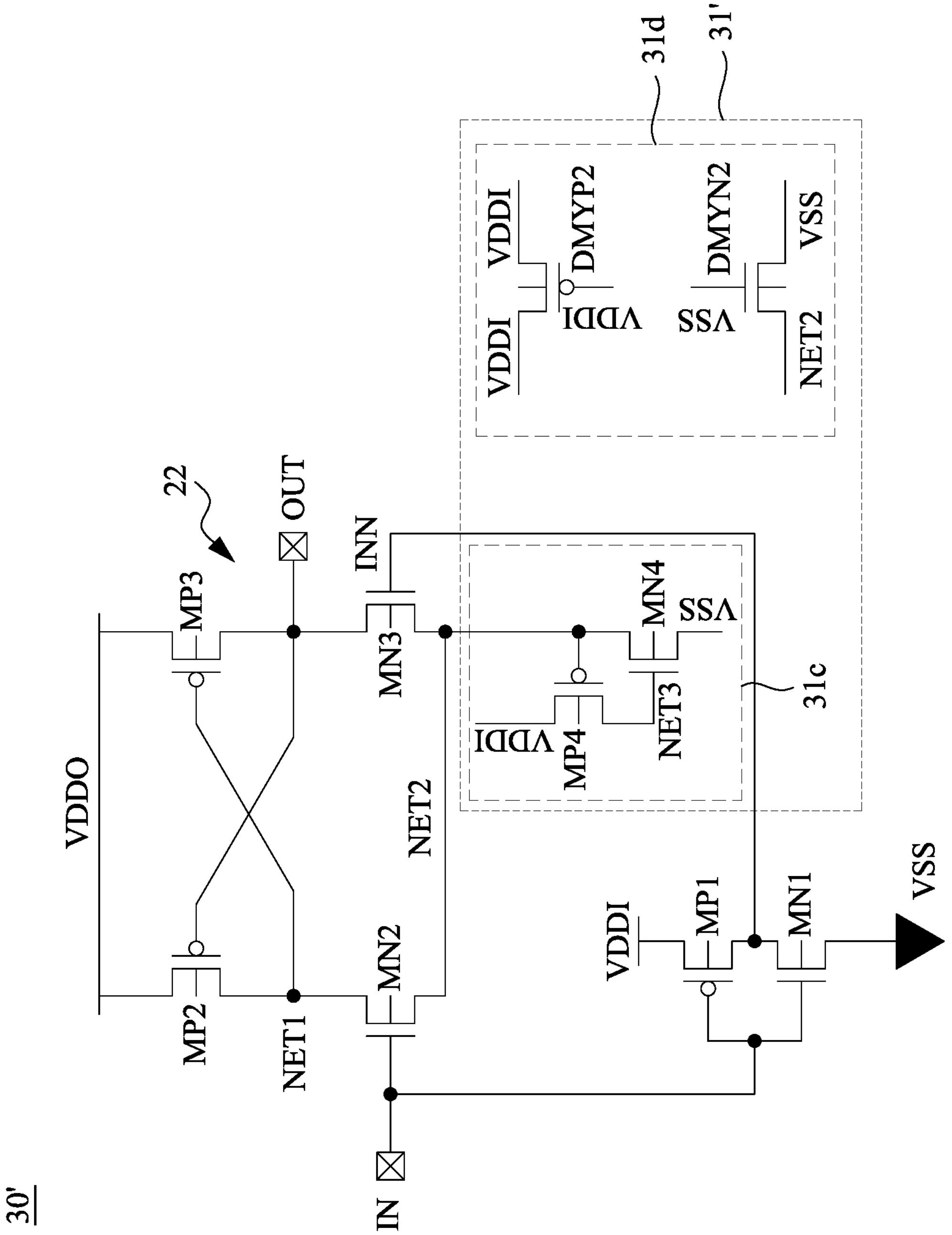
FIG. 3C is an equivalent circuit of part of an integrated circuit corresponding to the integrated circuit of FIG. 1, in accordance with various embodiment.

Reference is now made to FIG. 3C. FIG. 3C is an equivalent circuit of part of an integrated circuit 30' corresponding to the integrated circuit 10 of FIG. 1, in accordance with various embodiment. In some embodiments, the integrated circuit 30' includes an ESD protection circuit 31' configured with respect to the ESD protection circuit 31.

Compared with the embodiments of FIG. 3B, instead of having more than one P type transistor coupled in series between the terminal NET2 and the transistor MN4, in the tie low circuit 31*c* of the ESD protection circuit 31' only one P-type transistor MP4 and the transistor MN4 are coupled to the terminal NET2. The dummy circuits 31*d* includes the transistor DMYN2 and a transistor DMYP2 having three terminals coupled to the voltage terminal VDDI.

Figure 4A:
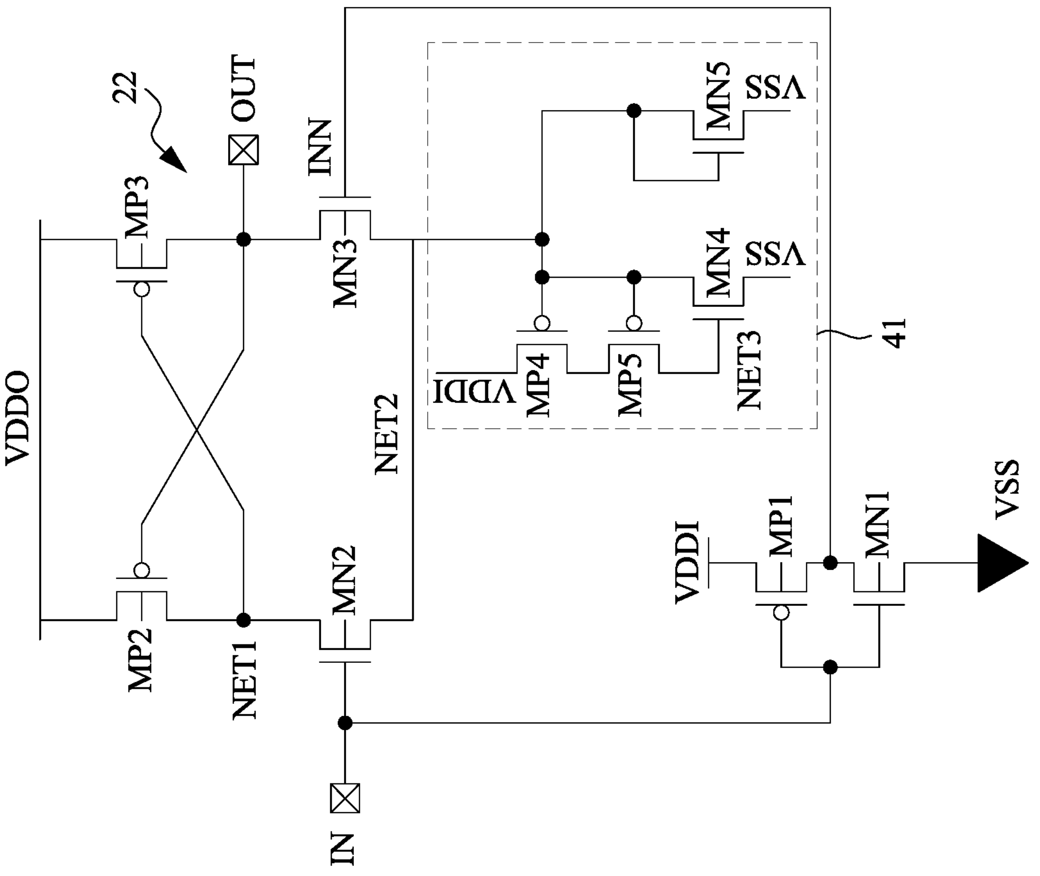
FIG. 4A is an equivalent circuit of part of an integrated circuit corresponding to the integrated circuit of FIG. 1, in accordance with some embodiments.
Figure 4B:
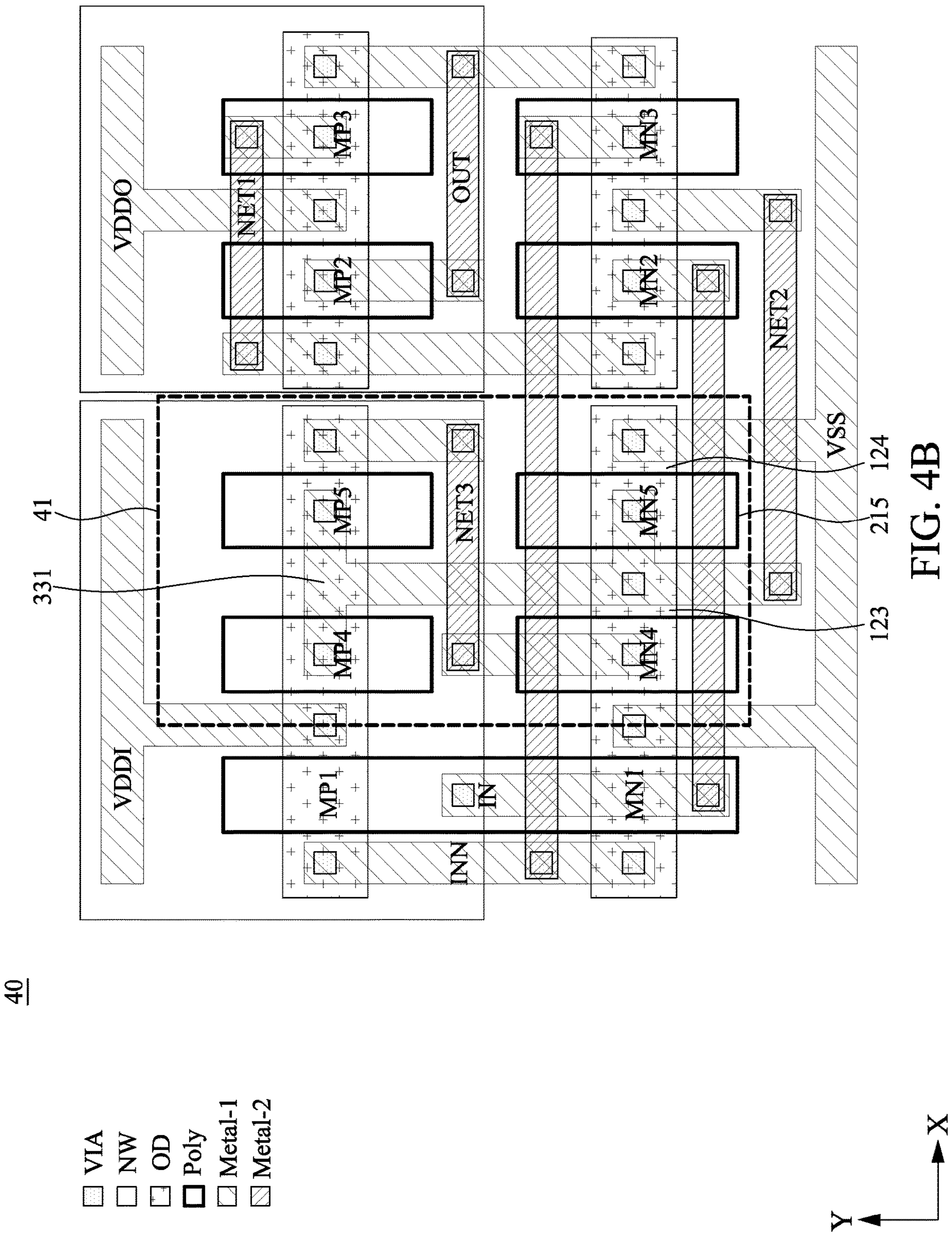
FIG. 4B is a layout diagram in a plan view of part of the integrated circuit in FIG. 4A, in accordance with some embodiments.

Reference is now made to FIGS. 4A-4B. FIG. 4A is an equivalent circuit of part of an integrated circuit 40 corresponding to the integrated circuit of FIG. 1, and FIG. 4B is a layout diagram in a plan view of part of the integrated circuit 40 in FIG. 4A, in accordance with some embodiments. With respect to the embodiments of FIGS. 1-3C, like elements in FIGS. 4A-4B are designated with the same reference numbers for ease of understanding. In some embodiments, the integrated circuit 40 is configured with respect to, for example, the integrated circuit 10 of FIG. 1.

In some embodiments, the integrated circuit 40 includes a ESD protection circuit 41 configured with respect to, for example, the ESD protection circuit 31 of FIG. 3A.

Compared with the ESD protection circuit 31 of FIG. 3A, the ESD protection circuit 41 in FIG. 4A includes the transistor MN5 having both gate and drain terminals coupled to the terminal NET2 and the source coupled to the voltage terminal VSS.

In operation, according to some embodiments, the transistor MN5 pulls down the voltage level of the terminal NET2 in response to high voltage level of the terminal NET2, which preventing the tie low circuit-consisted of the transistors MP4, MN4, and MP5—from being locked up at startup stage and accordingly stabilized the voltage level of the terminal NET2 to have the supply voltage VSS.

In the ESD event between the voltage terminals VDDI and VSS, a corresponding ESD current can be further discharged by the transistors MN4-MN5, protecting the internal circuit, for example, the level shifter circuit 22. Specifically, the transistors MN4-MN5 limit current and divide the voltage between the terminal NET2 and the voltage terminal VSS, and accordingly, the voltage drop Vgs of the transistor MN2 or transistor MN3 reduces, preventing the electrostatic charges accumulating at the voltage terminal VDDI being discharged at the input terminal IN to break down the gate of the transistor MN2 or at the terminal INN to break down the gate of the transistor MN3.

As shown in FIG. 4B, the transistor MN5 is arranged between the transistors MN1-MN2. The conductive line 331 further couples the gate 215, corresponding to the gate of the transistor MN5, and the active region 123, corresponding to the drain of the transistor MN5, to the terminal NET2.

With the configurations of the present application, the voltage drop Vgs of the transistor MN2 or transistor MN3 efficiently decreases to about 51%, compared with some approaches.

Figure 5A:
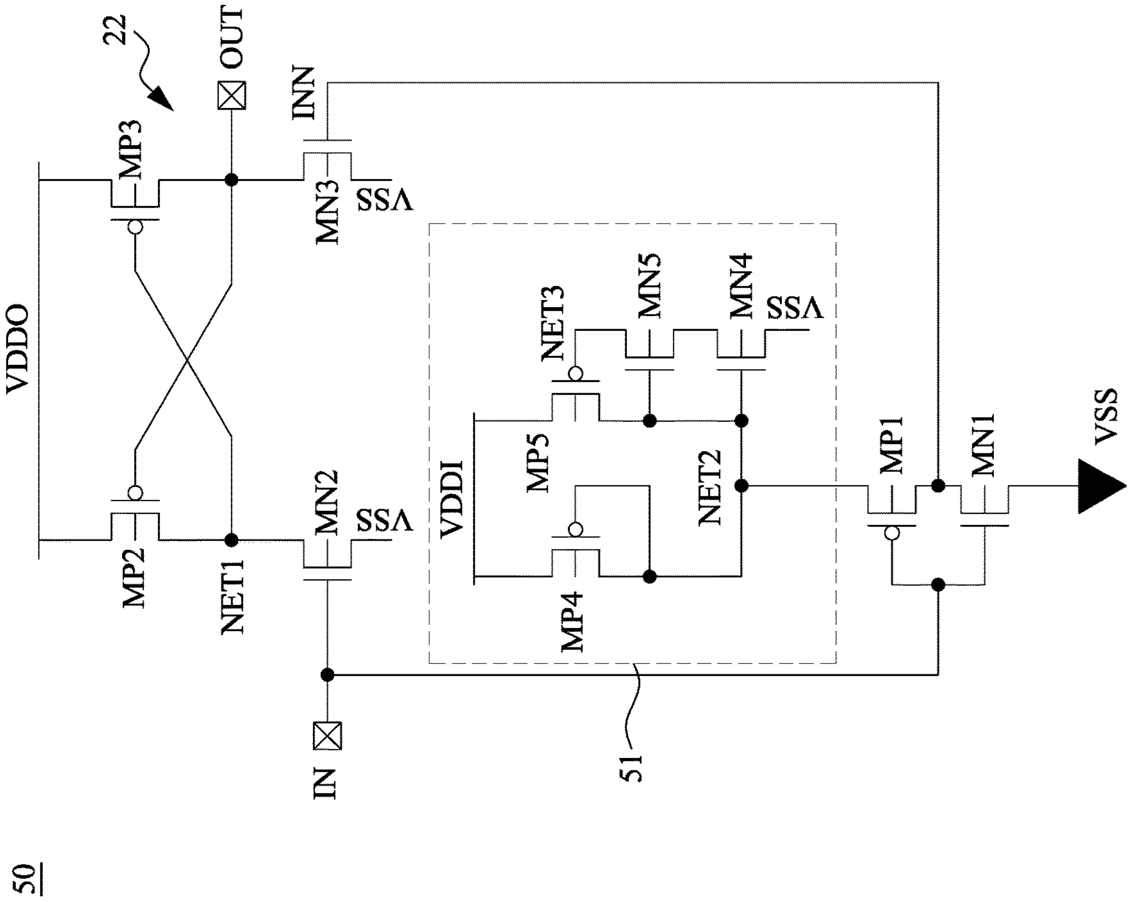
FIG. 5A is an equivalent circuit of part of an integrated circuit corresponding to the integrated circuit of FIG. 1, in accordance with some embodiments.
Figure 5B:
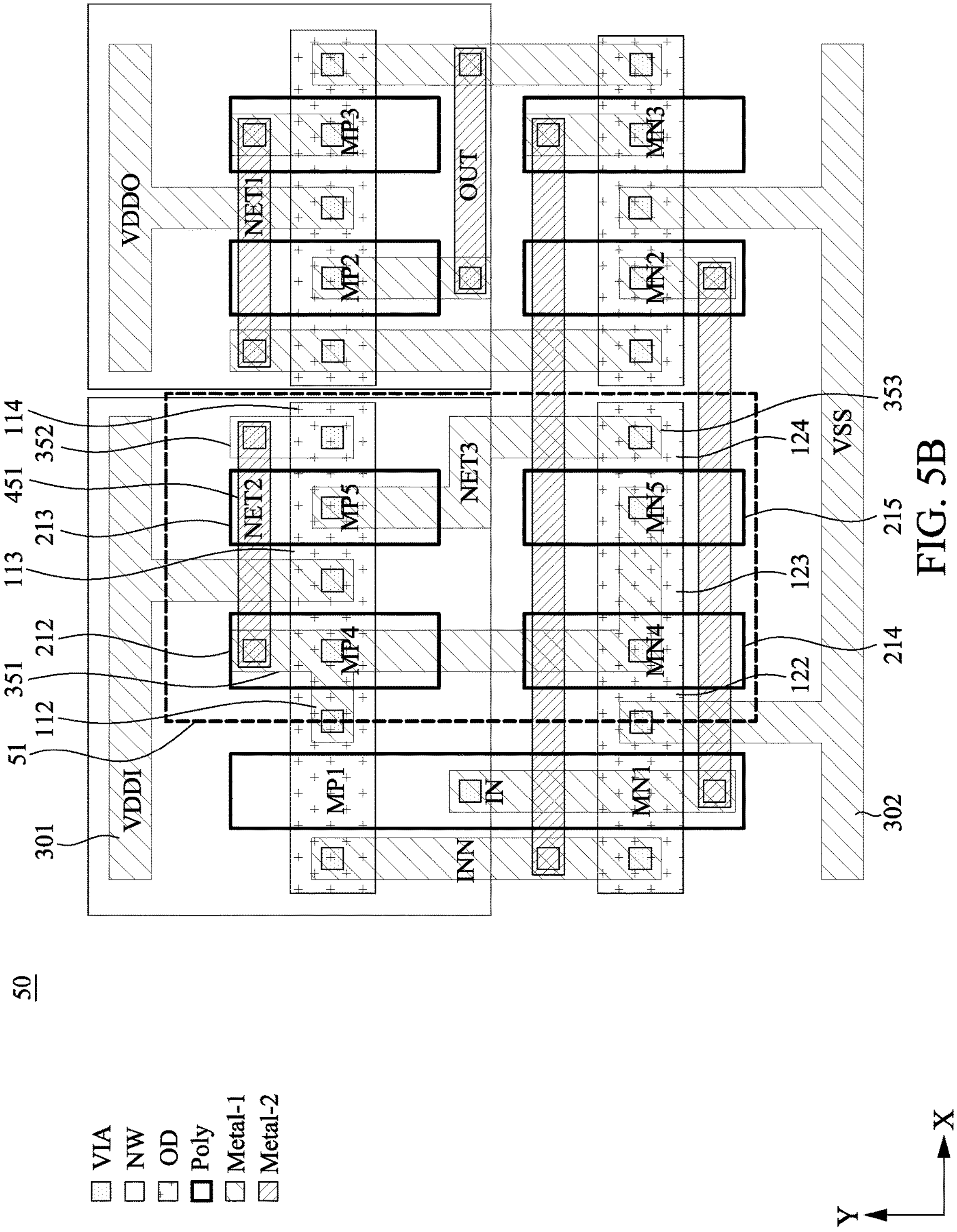
FIG. 5B is a layout diagram in a plan view of part of the integrated circuit in FIG. 5A, in accordance with some embodiments.

Reference is now made to FIGS. 5A-5B. FIG. 5A is an equivalent circuit of part of an integrated circuit 50 corresponding to the integrated circuit 10 of FIG. 1, and FIG. 5B is a layout diagram in a plan view of part of the integrated circuit 50 in FIG. 5A, in accordance with some embodiments. With respect to the embodiments of FIGS. 1-4B, like elements in FIGS. 5A-5B are designated with the same reference numbers for ease of understanding. In some embodiments, the integrated circuit 50 is configured with respect to, for example, the integrated circuit 10 of FIG. 1.

Compared with the embodiments of FIGS. 3A-3B, the sources of the transistors MN2-MN3 are coupled to the voltage terminal VSS. The integrated circuit 50 includes an ESD protection circuit 51. In some embodiments, the ESD protection circuit 51 is configured as a tie high circuit coupled to the source of the transistor MP1 in the inverter 23 at the terminal NET2 to transmit the supply voltage VDDI to the integrated circuit 50, as shown in FIG. 5A.

Specifically, in the ESD protection circuit 51, the transistor MP4 is diode-connected between the voltage terminal VDDI and the terminal NET2. The source of the transistor MP5 is coupled to the voltage terminal VDDI and the drain is coupled to the terminal NET2. The transistors MN4-MN5 are coupled in series between the gate of the transistor MP5 and the voltage terminal VSS, in which the gates of the transistors MN4-MN5 are coupled together to the terminal NET2.

In some embodiments, the ESD protection circuit 51 is further configured to adjust the voltage level of the terminal NET2 (referred to as the internal terminal of the level shifter circuit 22) according to the voltage at the voltage terminal VDDI. the transistors MP5, MN4-MN5 are configured as a feedback circuit and the transistor MP4 is turned on in response to the low voltage level at the terminal NET2. Accordingly, the voltage level of the terminal NET2 is pulled up based on the supply voltage VDDI. Alternatively stated, the transistors MP4-MP5 and MN4-MN5 are configured to transmit the supply voltage VDDI to the integrated circuit 50. Furthermore, the signals having high voltage level are generated according to the ESD protection circuit 51.

In the ESD event from the voltage terminals VDDI and VSS and/or from the voltage terminals VDDI to VDDO, a corresponding ESD current can be further discharged by the transistors MP4-MP5, protecting the internal circuit, for example, the level shifter circuit 22. Specifically, the transistors MP4-MP5 limit current and divide the voltage, and accordingly, the voltage drop Vgs of the transistor MN2 or transistor MN3 reduces. With the configurations of the present application, the voltage drop Vgs of the transistor MN2 or transistor MN3 efficiently decreases to about 69%, compared with some approaches.

As shown in FIG. 5B, the integrated circuit 50 includes conductive lines 351-353 and a conductive trace 451. In some embodiments, the conductive lines 351-353 are configured with respect to, for example, the conductive lines 301-311 of FIG. 1. The conductive trace 451 is configured with respect to, for example, the conductive traces 401-404 of FIG. 1.

The conductive line 301 is coupled to the active region 113 corresponding to the sources of the transistors MP4-MP5 to provide the voltage VDDI to the integrated circuit 50. The conductive line 302 is coupled to the active region 122 corresponding to the source of the transistor MN4. The transistors MN4 and MP4 are aligned with each other in the layout view along y direction. The transistors MN5 and MP5 are aligned with each other in the layout view along y direction. The gates 212, 214-215 correspond to the gates of the transistors MP4, MN4-MN5 separately and are coupled with each other by the conductive line 351 and further coupled to the active region 112 corresponding to the drain of the transistor MP4. In addition, the active region 114 corresponding to the drain of the transistor MP5 is further coupled to the conductive line 351 by the conductive line 352 and the conductive trace 451 corresponding to the terminal NET2. The gate 213 corresponding to the gate of the transistor MP5 is coupled to the active region 124 corresponding to the drain of the transistor MN5 through the conductive line 353. The conductive line 353 corresponds to the terminal NET3.

Figure 6A:
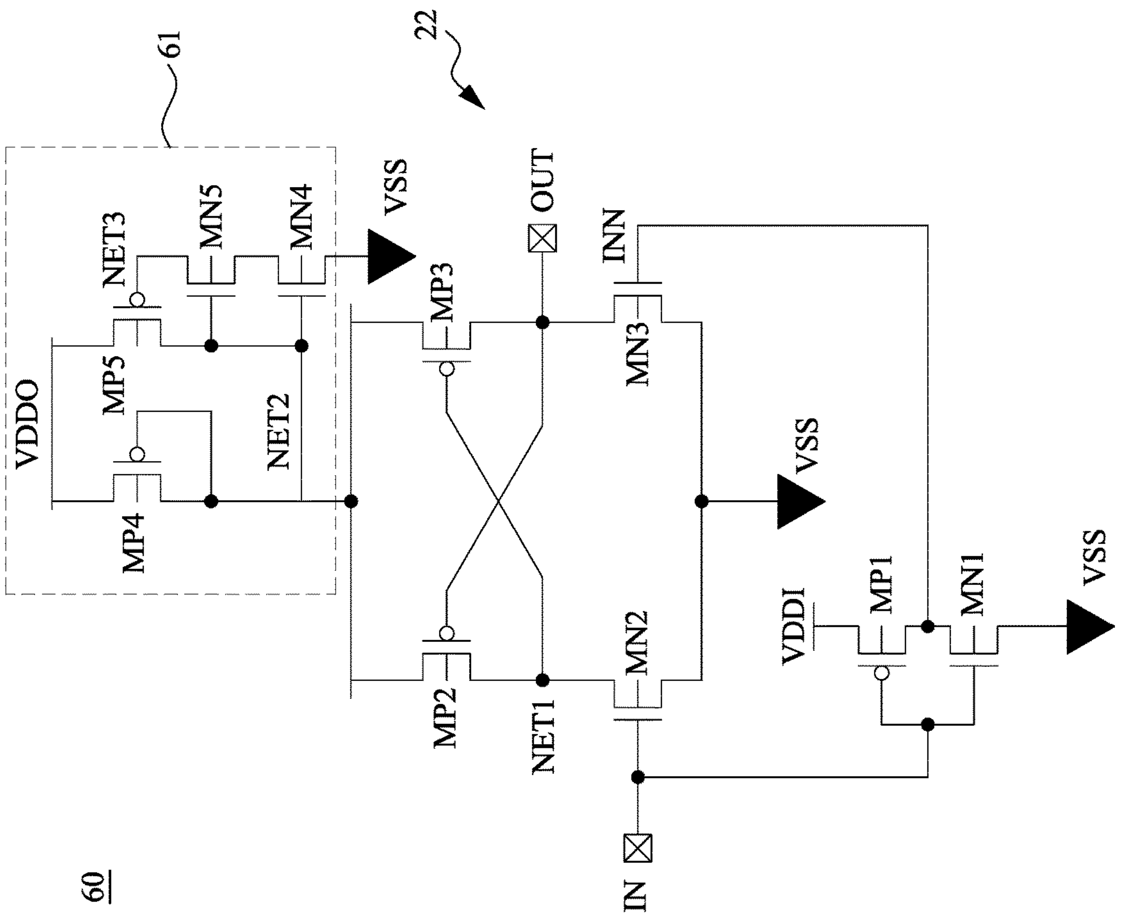
FIG. 6A is an equivalent circuit of part of an integrated circuit corresponding to the integrated circuit of FIG. 1, in accordance with some embodiments.
Figure 6B:
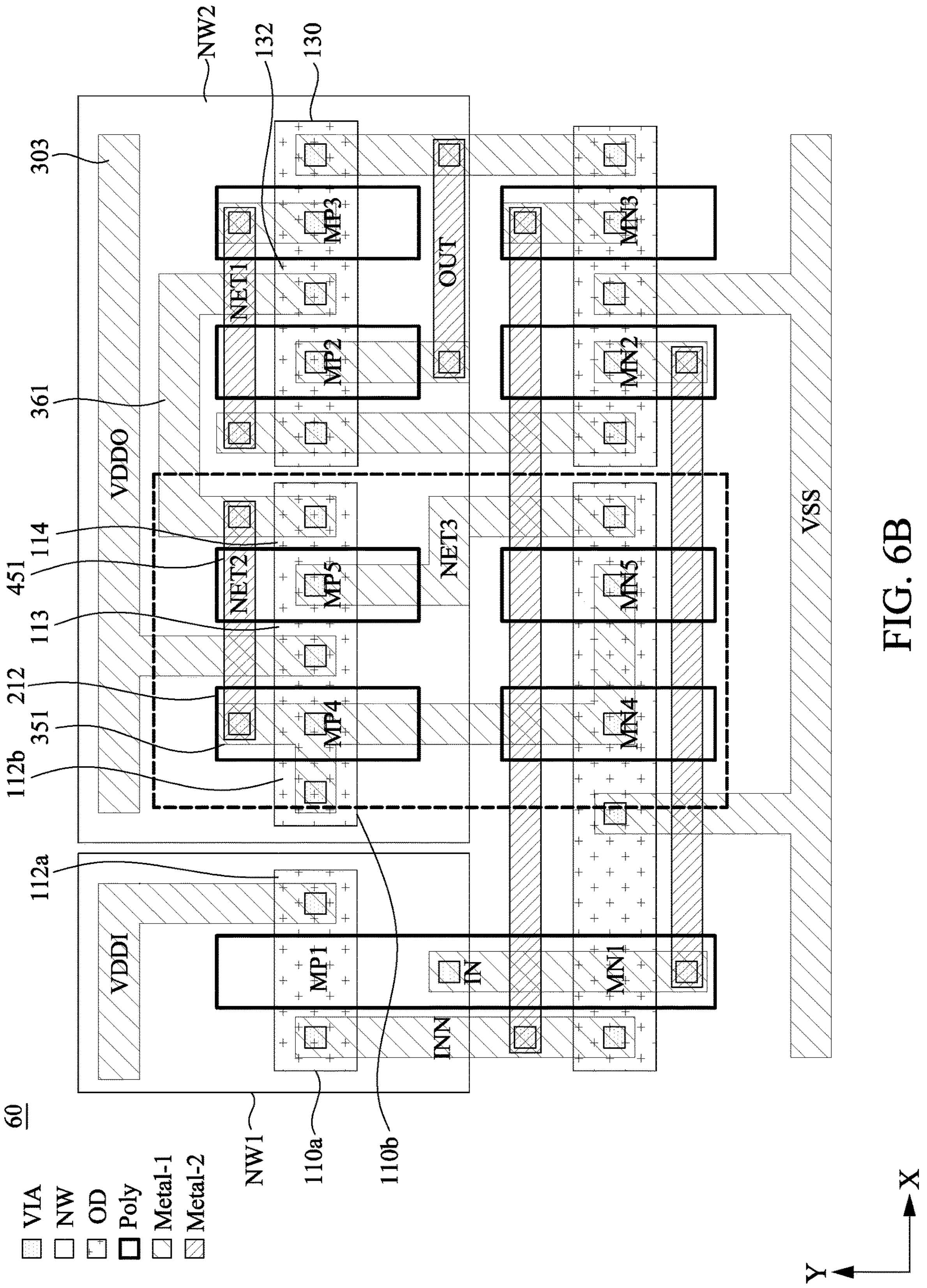
FIG. 6B is a layout diagram in a plan view of part of the integrated circuit in FIG. 6A, in accordance with some embodiments.

Reference is now made to FIGS. 6A-6B. FIG. 6A is an equivalent circuit of part of an integrated circuit 60 corresponding to the integrated circuit 10 of FIG. 1. FIG. 6B is a layout diagram in a plan view of part of the integrated circuit 60 in FIG. 6A, in accordance with some embodiments. With respect to the embodiments of FIGS. 1-5B, like elements in FIGS. 6A-6B are designated with the same reference numbers for ease of understanding. In some embodiments, the integrated circuit 60 is configured with respect to, for example, the integrated circuit 10 of FIG. 1.

Compared with the embodiments of FIGS. 5A-5B, instead of coupling the ESD protection circuit between the voltage terminals VDDI and VSS, the integrated circuit 60 includes an ESD protection circuit 61 that is coupled between the voltage terminals VDDO and VSS and configured with respect to, for example, the ESD protection circuit 51 of FIGS. 5A-5B.

In some embodiments, the ESD protection circuit 61 is configured as a tie high circuit coupled to the source of the transistors MP2-MP3 at the terminal NET2 to provide the supply voltage VDDO to the integrated circuit 60, as shown in FIG. 6A.

Specifically, the transistors MP1 and MN1 operate in the VDDI voltage domain and the transistor MP2-MP5 and the transistor MN2-MN5 operate in the VDDO voltage domain. In the ESD protection circuit 61, the transistor MP4 is diode-connected between the voltage terminal VDDO and the terminal NET2. The source of the transistor MP5 is coupled to the voltage terminal VDDO and the drain is coupled to the terminal NET2. The transistors MN4-MN5 are coupled in series between the gate of the transistor MP5 and the voltage terminal VSS, in which the gates of the transistors MN4-MN5 are coupled together to the terminal NET2.

In some embodiments, the transistors MP5, MN4-MN5 are configured as a feedback circuit and the transistor MP4 is turned on in response to the low voltage level at the terminal NET2. Accordingly, the voltage level of the terminal NET2 is pulled up based on the supply voltage VDDO.

In the ESD event from the voltage terminals VDDO and VSS and/or from the voltage terminals VDDO to VDDI, a corresponding ESD current can be further discharged by the transistors MP4-MP5, protecting the internal circuit, for example, the level shifter circuit 22. Specifically, the transistors MP4-MP5 limit current and divide the voltage, and accordingly, the voltage drop Vgs of the transistors in the level shifter circuit 22 reduce. With the configurations of the present application, the voltage drop Vgs efficiently decreases to about 70%, compared with some approaches.

As shown in FIG. 6B, the integrated circuit 60 includes the active area 110 that has an active area 110*a* arranged in the well NW1 and an active area 110*b* in the well NW2. The active areas 110*a*-110*b* are separated from each other in x direction. The active areas 110*b* and 130 are separated from each other in x direction.

In some embodiments, an active region 112*a* in the active area 110*a* corresponding to the source of the transistor MP1 is coupled to the conductive line 301 to receive the supply voltage VDDI. An active region 112*b* in the active area 110*b* corresponds to the drain of the transistor MP4 and is coupled to the gate 212 and the conductive line 351. The active region 114 in the active area 110*b* corresponding to the drain of the transistor MP5 is further coupled to the active region 132 through a conductive line 361 that is configured with respect to, for example, the conductive lines 301-311 of FIG. 1. The conductive trace 451 corresponding to the terminal NET2 couples the conductive line 351 to the conductive line 361. The active region 113 corresponding to the sources of the transistors MP4-MP5 is coupled to the conductive line 303 to receive the supply voltage VDDO for the integrated circuit 60.

Figure 7A:
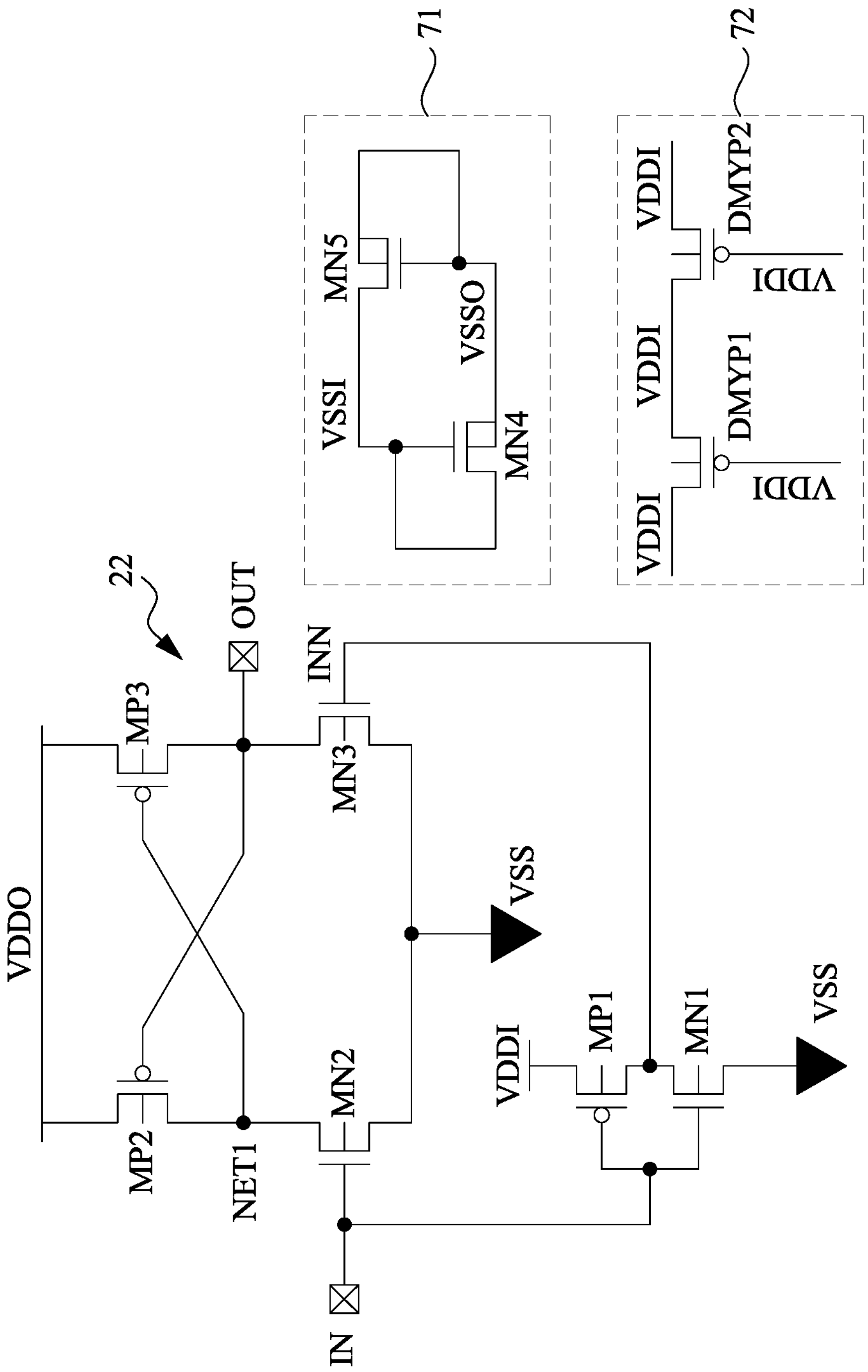
FIG. 7A is an equivalent circuit of part of an integrated circuit corresponding to the integrated circuit of FIG. 1, in accordance with some embodiments.
Figure 7B:
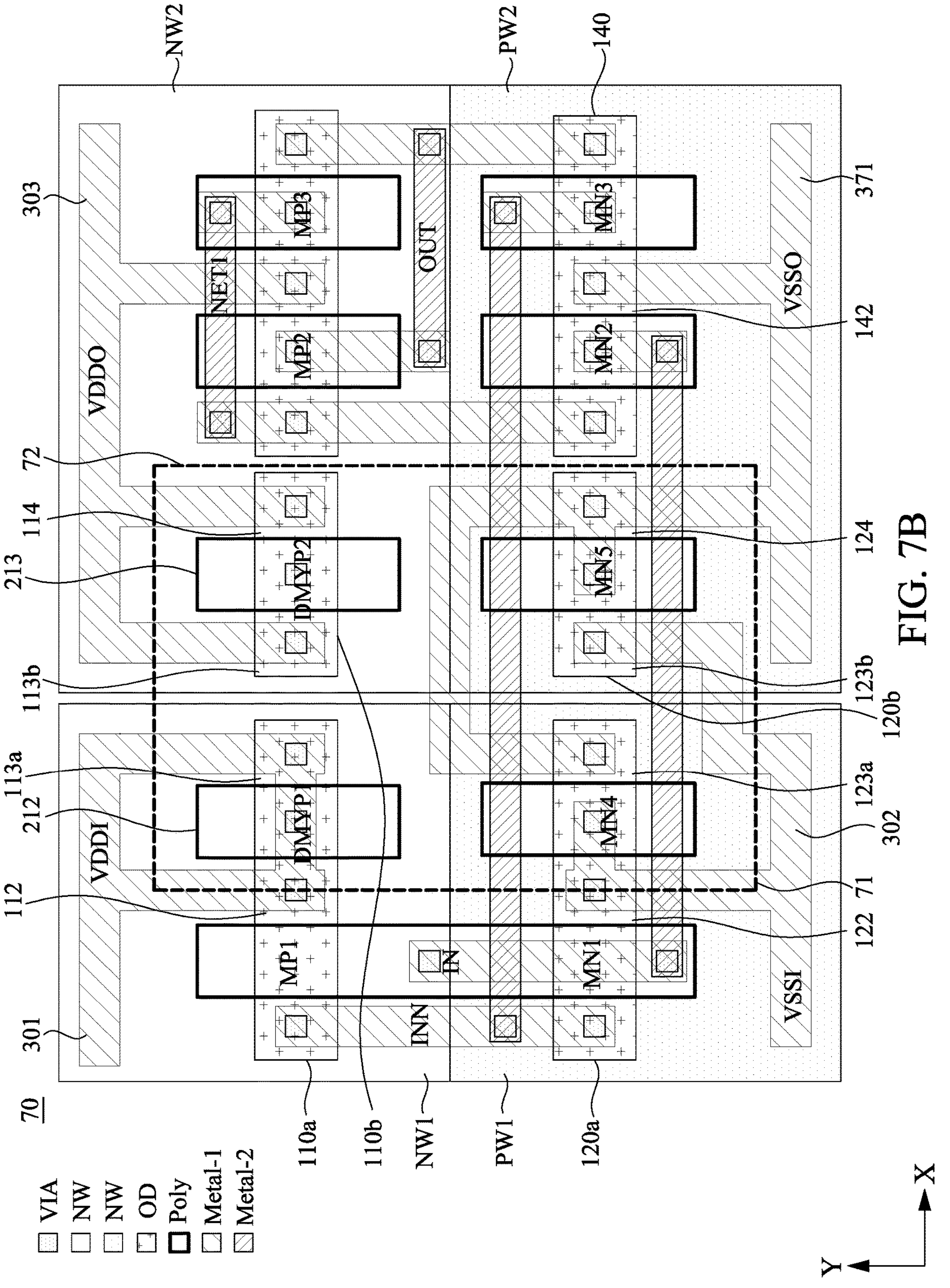
FIG. 7B is a layout diagram in a plan view of part of the integrated circuit in FIG. 7A, in accordance with some embodiments.

Reference is now made to FIGS. 7A-7B. FIG. 7A is an equivalent circuit of part of an integrated circuit 70 corresponding to the integrated circuit 10 of FIG. 1, FIG. 7B is a layout diagram in a plan view of part of the integrated circuit 70 in FIG. 7A, in accordance with some embodiments. With respect to the embodiments of FIGS. 1-6B, like elements in FIGS. 7A-7B are designated with the same reference numbers for ease of understanding. In some embodiments, the integrated circuit 70 is configured with respect to, for example, the integrated circuit 10 of FIG. 1.

For illustration, the integrated circuit 70 includes an ESD protection circuit 71 and a dummy circuit 72 having transistors DMYP1-DMYP2 that are coupled to the voltage terminal VDDI. The ESD protection circuit 71 is coupled between the voltage terminals VDDI and VSSO and configured to provide ESD protection and anti-disturb capability for the level shifter circuit 22 in the integrated circuit 70.

Specifically, in some embodiments, the ESD protection circuit 71 includes back-to-back diodes consisting of the transistors MN4-MN5. Specifically, the gate and drain terminals of the transistors MN4 are coupled together to the voltage terminal VSSI and the source of the transistor MN5. Similarly, the gate and drain terminals of the transistors MN5 are coupled together to the voltage terminal VSSO and the source of the transistor MN4.

In operation, when a disturbance occurs in the supply voltage VSSI, the disturbance is not transmitted to the voltage terminal VSSO due to the limitation of the turn-on voltage of the back-to-back diodes, so the anti-disturb effect is generated. The same applies to the supply voltage VSSO to be having a disturbance.

In some embodiments of the ESD event occurring on signals in the integrated circuit 70, the sharp high voltage will turn on the back to back diodes, and the electrostatic current can be discharged to the voltage terminal VSSI or the voltage terminal VSSO through one of the diodes to protect the internal circuit, for example, level shifter circuit 22 of the integrated circuit 70.

In FIG. 7B, compared with the embodiments of FIG. 6B, the active area 110*a* includes the active region 112 and an active region 113*a* that correspond to the transistor DMYP1 and are coupled to the conductive line 301 to receive the supply voltage VDDI for the integrated circuit 70. The gate 212 corresponds to the gate of the transistor DMYP1.

An active region 113*b* in the active area 110*b* and the active region 114 correspond to the transistor DMYP2 and are coupled to the conductive line 303 to receive the supply voltage VDDO for the integrated circuit 70. The gate 213 corresponds to the gate of the transistor DMYP2.

The integrated circuit 70 includes an active area 120*a* in a P-type well PW1 and active areas 120*b* and 140 in another P-type well PW2. In some embodiments, the P-type wells PW1-PW2 are included in the substrate. In some embodiments, the P-wells PW1-PW2 disclosed herein are formed by doping a substrate with p-type dopants, unless mentioned otherwise. The active region 122 corresponding to the drain of the transistor MN4 is coupled to the gate 214 of the transistor MN4 and an active region 123*b*, corresponding to the source of the transistor MN5, by the conductive line 302 providing the supply voltage VSSI. An active region 123*a* in the active area 120*a* corresponds to the source of the transistor MN4 and is coupled to the gate of the transistor MN5 and the active region 124 corresponding to the drain of the transistor MN5.

The configurations of FIGS. 1-7B are given for illustrative purposes. Various implements are within the contemplated scope of the present disclosure. For example, in some embodiments, the wells PW1-PW2 are formed as a single P-type well. In various embodiments, the wells PW1-PW2 are parts of the P-type substrate.

Figure 8:
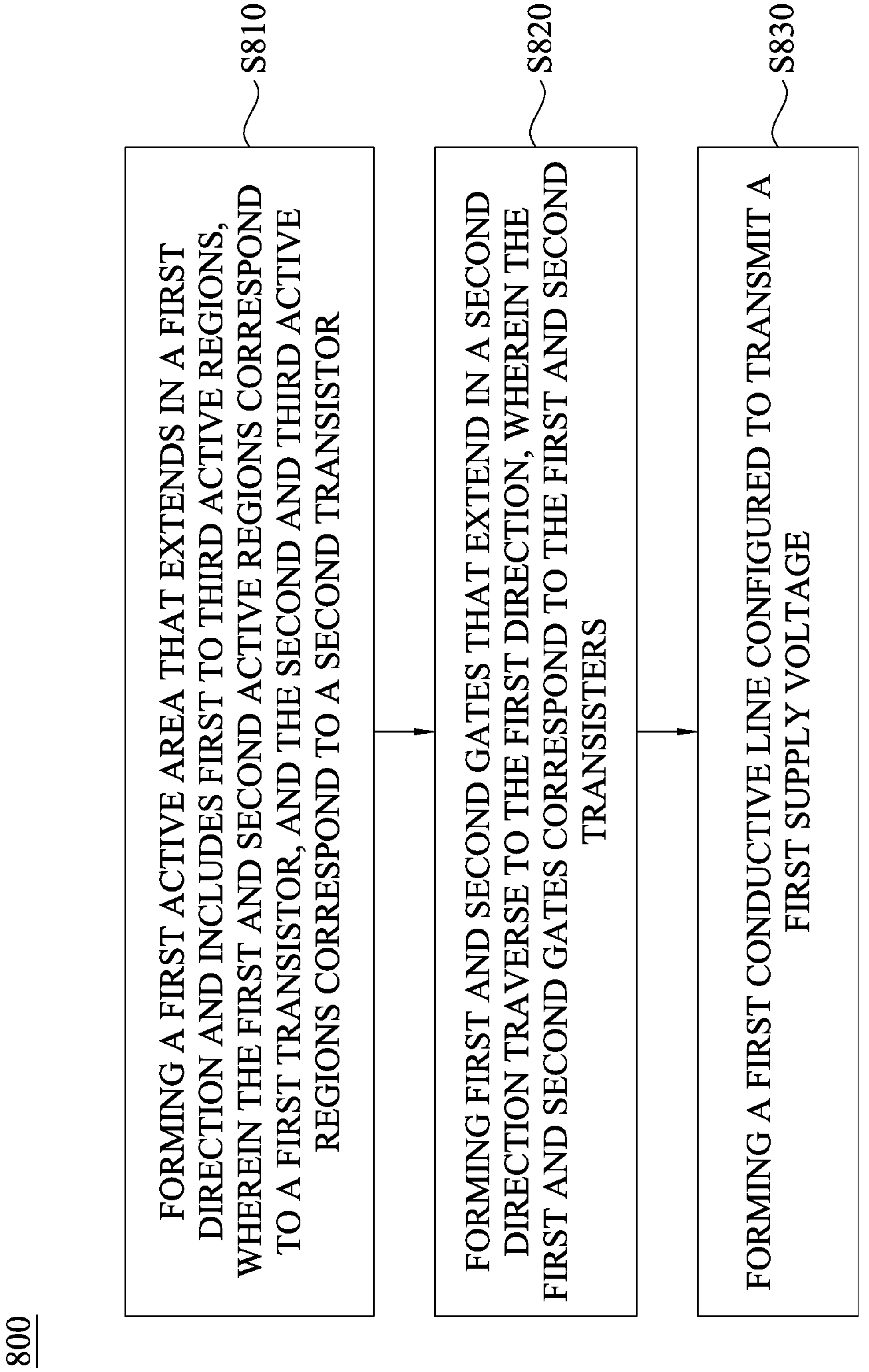
FIG. 8 is a flow chart of a method of manufacturing an integrated circuit, in accordance with some embodiments.

Reference is now made to FIG. 8. FIG. 8 is a flow chart of a method 800 of manufacturing at least one of the integrated circuits 10-70, in accordance with some embodiments. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements. The method 800 includes operations S810, S820, and S830 that are described below with reference to FIGS. 1-7B.

In operation S810, as shown in the embodiments of FIG. 4B, the active area 120 is formed to extend in x direction and includes the active regions 122-124. The active regions 122-123 correspond to the transistor MN4, and the active regions 123-124 correspond to the transistor MN5.

In operation S820, the gates 214-215 are formed to extend in y direction traverse to the x direction, in which the gates 214-215 correspond to the transistor MN4-MN5 respectively. In some embodiments, in the layout view, the inverter 23 having the transistors MN1 and MP1 and the output stage circuit 24 having the transistors MP3 and MN3 are arranged on the opposite sides of the gate 214 in x direction.

In operations S830, the conductive line 302 is formed and configured to transmit the supply voltage VSS. In some embodiments, the active region 122 is coupled to the conductive line 302. The active region 123 is coupled to the terminal NET2 of the level shifter circuit 22 as shown in FIG. 4B. The gate 214 is coupled to the terminal NET2 of the level shifter circuit 22 as shown in FIG. 5B.

In some embodiments, as shown in FIG. 4B, the active area 110 is formed to extend in x direction in the first semiconductor layer. The conductive line 331 is formed to extend in y direction in the second semiconductor layer above the first semiconductor layer to couple to the transistor MN5. The conductive line 331 overlaps the active areas 110-120.

Furthermore, the conductive trace 431 is formed in the third semiconductor layer above the second semiconductor layer to pass the conductive line 331 and to couple to the gate 214 of the transistor MN4. In the layout view, the conductive trace 431 is disposed between the active areas 110-120.

In some embodiments, the active region 112 of the active area 110 having a conductivity type different from that of the active area 120 is formed to receive the supply voltage VDDI. In addition, the gate 212 is formed and aligned with the gate 214 in y direction, as shown in FIG. 4B. The gate 212 is coupled to the terminal NET2 of the level shifter circuit 22.

Figure 9:
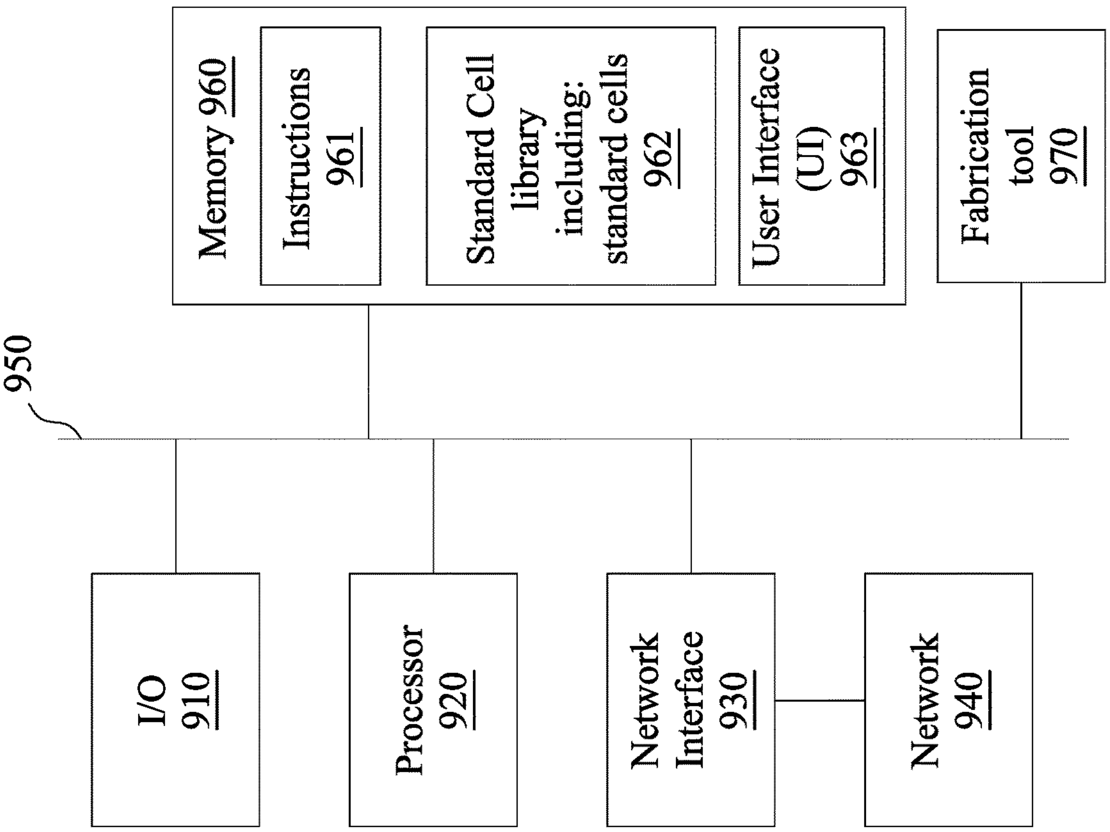
FIG. 9 is a block diagram of a system for designing the integrated circuit layout design, in accordance with some embodiments of the present disclosure.

Reference is now made to FIG. 9. FIG. 9 is a block diagram of an electronic design automation (EDA) system 900 for designing the integrated circuit layout design, in accordance with some embodiments of the present disclosure. EDA system 900 is configured to implement one or more operations of the method 800 disclosed in FIG. 8, and further explained in conjunction with FIGS. 1-7B. In some embodiments, EDA system 900 includes an APR system.

In some embodiments, EDA system 900 is a general purpose computing device including a hardware processor 920 and a non-transitory, computer-readable storage medium 960. Storage medium 960, amongst other things, is encoded with, i.e., stores, computer program code (instructions) 961, i.e., a set of executable instructions. Execution of instructions 961 by hardware processor 920 represents (at least in part) an EDA tool which implements a portion or all of, e.g., the method 800.

The processor 920 is electrically coupled to computer-readable storage medium 960 via a bus 950. The processor 920 is also electrically coupled to an I/O interface 910 and a fabrication tool 970 by bus 950. A network interface 930 is also electrically connected to processor 920 via bus 950. Network interface 930 is connected to a network 940, so that processor 920 and computer-readable storage medium 960 are capable of connecting to external elements via network 940. The processor 920 is configured to execute computer program code 961 encoded in computer-readable storage medium 960 in order to cause EDA system 900 to be usable for performing a portion or all of the noted processes and/or methods. In one or more embodiments, processor 920 is a central processing unit (CPU), a multi-processor, a distributed processing system, an application specific integrated circuit (ASIC), and/or a suitable processing unit.

In one or more embodiments, computer-readable storage medium 960 is an electronic, magnetic, optical, electromagnetic, infrared, and/or a semiconductor system (or apparatus or device). For example, computer-readable storage medium 960 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 960 includes a compact disk-read only memory (CD-ROM), a compact disk-read/write (CD-R/W), and/or a digital video disc (DVD).

In one or more embodiments, storage medium 960 stores computer program code 961 configured to cause EDA system 900 (where such execution represents (at least in part) the EDA tool) to be usable for performing a portion or all of the noted processes and/or methods. In one or more embodiments, storage medium 960 also stores information which facilitates performing a portion or all of the noted processes and/or methods. In one or more embodiments, storage medium 960 stores library 962 of standard cells including such standard cells as disclosed herein, for example, a cell including transistors MN1-MN5 and MP1-MP5.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 920.

EDA system 900 also includes network interface 930 coupled to processor 920. Network interface 930 allows EDA system 900 to communicate with network 940, to which one or more other computer systems are connected. Network interface 930 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

EDA system 900 also includes the fabrication tool 970 coupled to processor 920. The fabrication tool 970 is configured to fabricate integrated circuits, e.g., the integrated circuit 10 illustrated in FIG. 1, according to the design files processed by the processor 920.

EDA system 900 is configured to receive information through I/O interface 910. The information received through I/O interface 910 includes one or more of instructions, data, design rules, libraries of standard cells, and/or other parameters for processing by processor 920. The information is transferred to processor 920 via bus 950. EDA system 900 is configured to receive information related to a UI through I/O interface 910. The information is stored in computer-readable medium 960 as user interface (UI) 963.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
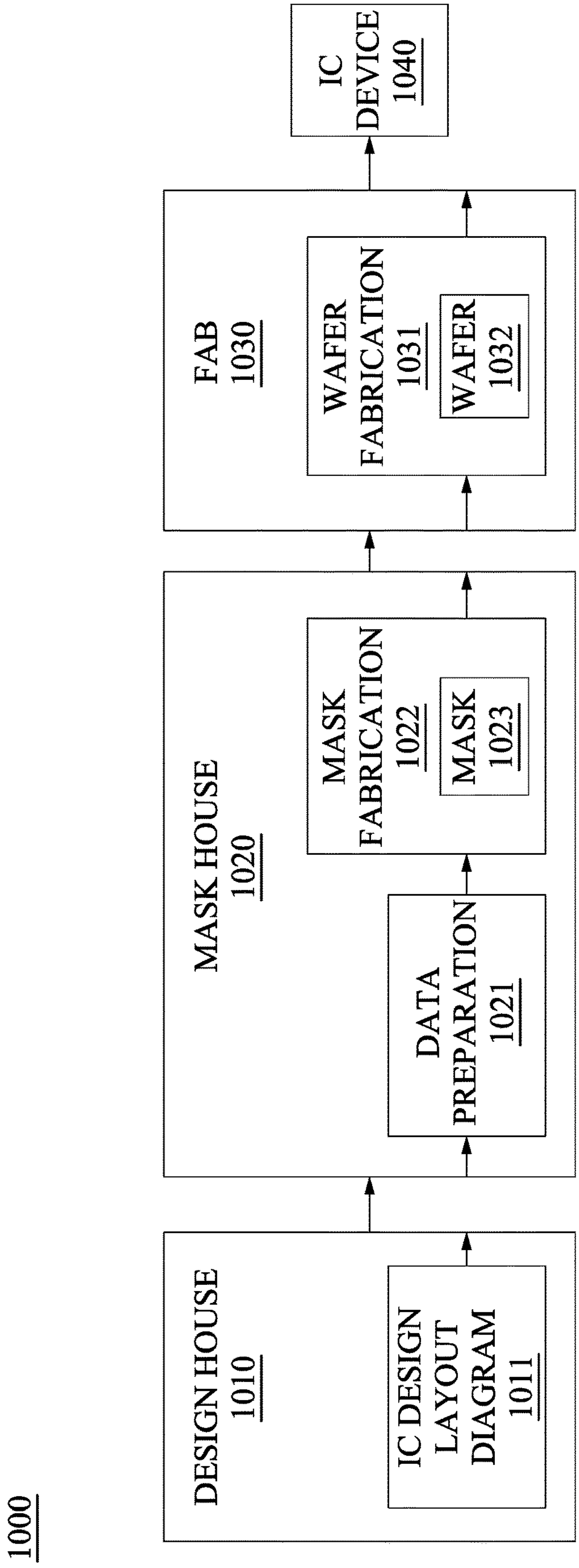
FIG. 10 is a block diagram of an integrated circuit manufacturing system, and an integrated circuit manufacturing flow associated therewith, in accordance with some embodiments.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1010, a mask house 1020, and an IC manufacturer/fabricator ("fab") 1030, that interact with one another in the design, development, and manufacturing cycles and/or services related to manufacturing an IC device 1040. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1010, mask house 1020, and IC fab 1030 is owned by a single larger company. In some embodiments, two or more of design house 1010, mask house 1020, and IC fab 1030 coexist in a common facility and use common resources.

Design house (or design team) 1010 generates an IC design layout diagram 1011. IC design layout diagram 1011 includes various geometrical patterns, for example, an IC layout design depicted in FIG. 2B, FIG. 3B, FIG. 4B, FIG. 5B, FIG. 6B and FIG. 7B, designed for an IC device 1040, for example, integrated circuits 20-70, discussed above with respect to FIG. 2B, FIG. 3B, FIG. 4B, FIG. 5B, FIG. 6B and FIG. 7B. The geometrical patterns correspond to patterns of metal, oxide, or semiconductor layers that make up the various components of IC device 1040 to be fabricated. The various layers combine to form various IC features. For example, a portion of IC design layout diagram 1011 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1010 implements a proper design procedure to form IC design layout diagram 1011. The design procedure includes one or more of logic design, physical design or place and route. IC design layout diagram 1011 is presented in one or more data files having information of the geometrical patterns. For example, IC design layout diagram 1011 can be expressed in a GDSII file format or DFII file format.

Mask house 1020 includes data preparation 1021 and mask fabrication 1022. Mask house 1020 uses IC design layout diagram 1011 to manufacture one or more masks 1023 to be used for fabricating the various layers of IC device 1040 according to IC design layout diagram 1011. Mask house 1020 performs mask data preparation 1021, where IC design layout diagram 1011 is translated into a representative data file ("RDF"). Mask data preparation 1021 provides the RDF to mask fabrication 1022. Mask fabrication 1022 includes a mask writer. A mask writer converts the RDF to an image on a substrate, such as a mask (reticle) 1023 or a semiconductor wafer 1032. The IC design layout diagram 1011 is manipulated by mask data preparation 1021 to comply with particular characteristics of the mask writer and/or requirements of IC fab 1030. In FIG. 10, data preparation 1021 and mask fabrication 1022 are illustrated as separate elements. In some embodiments, data preparation 1021 and mask fabrication 1022 can be collectively referred to as mask data preparation.

In some embodiments, data preparation 1021 includes optical proximity correction (OPC) which uses lithography enhancement techniques to compensate for image errors, such as those that can arise from diffraction, interference, other process effects and the like. OPC adjusts IC design layout diagram 1011. In some embodiments, data preparation 1021 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1021 includes a mask rule checker (MRC) that checks the IC design layout diagram 1011 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1011 to compensate for limitations during mask fabrication 1022, which may undo part of the modifications performed by OPC in order to meet mask creation rules.

In some embodiments, data preparation 1021 includes lithography process checking (LPC) that simulates processing that will be implemented by IC fab 1030 to fabricate IC device 1040. LPC simulates this processing based on IC design layout diagram 1011 to create a simulated manufactured device, such as IC device 1040. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1011.

It should be understood that the above description of data preparation 1021 has been simplified for the purposes of clarity. In some embodiments, data preparation 1021 includes additional features such as a logic operation (LOP) to modify the IC design layout diagram 1011 according to manufacturing rules. Additionally, the processes applied to IC design layout diagram 1011 during data preparation 1021 may be executed in a variety of different orders.

After data preparation 1021 and during mask fabrication 1022, a mask 1023 or a group of masks 1023 are fabricated based on the modified IC design layout diagram 1011. In some embodiments, mask fabrication 1022 includes performing one or more lithographic exposures based on IC design layout diagram 1011. In some embodiments, an electron-beam (e-beam) or a mechanism of multiple e-beams is used to form a pattern on a mask (photomask or reticle) 1023 based on the modified IC design layout diagram 1011. Mask 1023 can be formed in various technologies. In some embodiments, mask 1023 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1023 includes a transparent substrate (for example, fused quartz) and an opaque material (for example, chromium) coated in the opaque regions of the binary mask. In another example, mask 1023 is formed using a phase shift technology. In a phase shift mask (PSM) version of mask 1023, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1022 is used in a variety of processes. For example, such a mask(s) is used in an ion implantation process to form various doped regions in semiconductor wafer 1032, in an etching process to form various etching regions in semiconductor wafer 1032, and/or in other suitable processes.

IC fab 1030 includes wafer fabrication 1031. IC fab 1030 is an IC fabrication business that includes one or more manufacturing facilities for the fabrication of a variety of different IC products. In some embodiments, IC Fab 1030 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1030 uses mask(s) 1023 fabricated by mask house 1020 to fabricate IC device 1040. Thus, IC fab 1030 at least indirectly uses IC design layout diagram 1011 to fabricate IC device 1040. In some embodiments, semiconductor wafer 1032 is fabricated by IC fab 1030 using mask(s) 1023 to form IC device 1040. In some embodiments, the IC fabrication includes performing one or more lithographic exposures based at least indirectly on IC design layout diagram 1011. Semiconductor wafer 1032 includes a silicon substrate or other proper substrate having material layers formed thereon. Semiconductor wafer 1032 further includes one or more of various doped regions, dielectric features, multilevel interconnects, and the like (formed at subsequent manufacturing steps).

As described above, a method and an integrated circuit are provided in the present application. By interposing an ESD protection circuit in structures configured as the level shifter circuit, ESD current induced in undesired ESD event is discharged further through the ESD protection circuit, without damaging internal components in the level shifter circuit, and accordingly, enhanced reliability is provided. In addition, according to some embodiments, with the configurations of the present application, no extra area is required for additional ESD related circuits.

In some embodiments, an integrated circuit is provided and includes a first active region of a first conductivity type coupled to a first voltage terminal and corresponding to a first terminal of a first transistor and a first terminal of a second transistor included in an inverter of a level shifter circuit, wherein the first transistor is configured to discharge electrostatic charges to the first voltage terminal; and second and third active regions, corresponding to a third transistor, of a second conductivity type different from the first conductivity type, wherein the second active region is coupled to a second voltage terminal, and the third active region is coupled to a first terminal, different from the second voltage terminal, of the level shifter circuit. The third transistor is configured to transmit a first supply voltage from the second voltage terminal for the integrated circuit.

In some embodiments, an integrated circuit is provided and includes a level shifter circuit and an ESD (electrostatic discharge) protection circuit. The level shifter circuit includes a first transistor and a second transistor separate from each other in a first direction in a layout view. Gate terminals of the first and second transistors are coupled together. The ESD protection circuit is coupled to an internal terminal of the level shifter circuit and configured to discharge electrostatic charges between a first voltage terminal and a second voltage terminal different from the first voltage terminal. The ESD protection circuit includes a third transistor having first and second active regions, wherein the first active region is coupled to the first terminal of the level shifter and the second active region is coupled to the second voltage terminal. In the layout view, the third transistor is arranged between the first transistor and the second transistor in the first direction.

In some embodiments, a method is provided and includes steps as below: forming a first active area that extends in a first direction and includes first to third active regions, wherein the first and second active regions correspond to a first transistor, and the second and third active regions correspond to a second transistor; forming first and second gates that extend in a second direction traverse to the first direction, wherein the first and second gates correspond to the first and second transistor respectively; and forming a first conductive line configured to transmit a first supply voltage. The first active region is coupled to the first conductive line, and first gate or the second active region is coupled to a terminal of a level shifter circuit. In a layout view, an inverter of the level shifter circuit and an output stage circuit of the level shifter circuit are arranged on the opposite sides of the first gate in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:

a first active region of a first conductivity type coupled to a first voltage terminal and corresponding to a first terminal of a first transistor and a first terminal of a second transistor included in an inverter of a level shifter circuit, wherein the first transistor is configured to discharge electrostatic charges to the first voltage terminal; and second and third active regions, corresponding to a third transistor, of a second conductivity type different from the first conductivity type, wherein the second active region is coupled to a second voltage terminal, and the third active region is coupled to a terminal, different from the second voltage terminal, of the level shifter circuit, wherein the third transistor is configured to transmit a first supply voltage from the second voltage terminal for the integrated circuit.

2. The integrated circuit of claim 1, further comprising:

a fourth active region of the first conductivity type, wherein the fourth active region corresponds to a second terminal of the first transistor, wherein the fourth active region is disposed in an active area extending in a first direction; and a conductive line extending in a second direction different from the first direction to couple the third active region to the fourth active region.

3. The integrated circuit of claim 1, further comprising:

a fourth active region of the first conductivity type, wherein the fourth active region corresponds to a second terminal of the first transistor, wherein the fourth active region is disposed in an active area extending in a first direction;

first and second gates extending in a second direction different from the first direction, wherein the second active region is interposed between the first and second gates; and a conductive line including a first portion extending in the second direction to couple the second gate to the fourth active region.

4. The integrated circuit of claim 3, further comprising:

a third gate coupled to a second portion, extending in the first direction, of the conductive line, wherein the fourth active region is interposed between the first and third gates.

5. The integrated circuit of claim 1, further comprising:

a fourth active region of the second conductivity type in a well of the first conductivity type, corresponding to a terminal of a fourth transistor, of the second conductivity type;

a gate corresponding to the first transistor; and a conductive trace configured to couple the fourth active region and the gate.

6. The integrated circuit of claim 1, further comprising:

a first gate that extends in a first direction and corresponds to the third transistor; and a second gate extending in the first direction, wherein the first and second gates are aligned along the first direction and are coupled together for transmitting the first supply voltage.

7. The integrated circuit of claim 6, further comprising:

a third gate extending in the first direction and corresponding to a fourth transistor;

a fourth active region, corresponding to a fifth transistor, of the first conductivity type; and a conductive line coupled to the third gate and the fourth active region and configured to transmit a second supply voltage.

8. The integrated circuit of claim 1, further comprising:

a fourth active region corresponding to a second terminal of the first transistor;

fifth and sixth active regions of the first conductivity type, wherein the fifth active region is coupled to the first voltage terminal;

a conductive structure coupled to the fourth active region, the sixth active region, and a third voltage terminal different from the first voltage terminal, wherein the first active region receives the first supply voltage, the fourth and sixth active regions receive a second supply voltage, and the first and second supply voltages are different from each other.

9. An integrated circuit, comprising:

a level shifter circuit, comprising:

a first transistor and a second transistor separate from each other in a first direction in a layout view, wherein gate terminals of the first and second transistors are coupled together; and an ESD (electrostatic discharge) protection circuit, coupled to an internal terminal of the level shifter circuit and configured to discharge electrostatic charges between a first voltage terminal and a second voltage terminal different from the first voltage terminal, wherein the ESD protection circuit comprises a third transistor having first and second active regions, wherein the first active region is coupled to the internal terminal of the level shifter circuit and the second active region is coupled to the second voltage terminal, wherein, in the layout view, the third transistor is arranged between the first transistor and the second transistor in the first direction.

10. The integrated circuit of claim 9, wherein the ESD protection circuit further comprises:

a fourth transistor having a third active region coupled to the first active region and a fourth active region coupled to the first voltage terminal, wherein in the layout view the fourth transistor is arranged between the first transistor and the second transistor in the first direction.

11. The integrated circuit of claim 10, wherein the ESD protection circuit further comprises:

a fifth transistor having a gate and a fifth active region that are coupled to a gate of the fourth transistor, wherein, in the layout view, the fifth transistor is arranged between the third transistor and the second transistor in the first direction.

12. The integrated circuit of claim 9, wherein the level shifter circuit further includes:

a fourth transistor coupled to the second transistor and separate from the second transistor in a second direction different from the first direction in the layout view, wherein the first to third transistors are in a first voltage domain, and the fourth transistor is in a second voltage domain different from the first voltage domain.

13. The integrated circuit of claim 9, wherein the ESD protection circuit further comprises:

a fourth transistor, wherein a gate of the fourth transistor is coupled to a gate of the third transistor and the internal terminal of the level shifter circuit, wherein the third and fourth transistors are aligned with each other along a second direction different from the first direction.

14. The integrated circuit of claim 9, wherein the ESD protection circuit further comprises:

a fourth transistor, wherein a first terminal of the fourth transistor is coupled to the second voltage terminal, a second terminal of the fourth transistor is coupled to the first active region, and the third and fourth transistor are separate from each other along the first direction in the layout view; and a fifth transistor, wherein a terminal of the fifth transistor is coupled to a gate of the fourth transistor, wherein the fourth and fifth transistors are aligned with each other along a second direction different from the first direction.

15. The integrated circuit of claim 9, wherein the ESD protection circuit further comprises:

a fourth transistor having third and fourth active regions, wherein the third active region is coupled to a third voltage terminal, and the fourth active region is coupled to the second active region and the second voltage terminal, wherein in the layout view the fourth transistor is arranged between the third transistor and the second transistor in the first direction.

16. The integrated circuit of claim 9, wherein the ESD protection circuit is further configured to adjust a voltage level at the internal terminal of the level shifter circuit to have a voltage of the first voltage terminal or a voltage of the second voltage terminal.

17. An integrated circuit, comprising:

a first active region of a first conductivity type coupled to a first voltage terminal and corresponding to a first terminal of a first transistor and a first terminal of a second transistor included in an inverter of a level shifter circuit;

a second active region of the first conductivity type coupled to a terminal of the level shifter circuit and corresponding to a second terminal of the first transistor; and a third active region of a second conductivity type coupled to the terminal and corresponding to a first terminal of a third transistor, wherein the second conductivity type is different from the first conductivity type;

wherein the second terminal of the first transistor is coupled to the first terminal of the third transistor.

18. The integrated circuit of claim 17, further comprising:

a fourth active region of the second conductivity type coupled to a second voltage terminal and corresponding to a second terminal of the third transistor.

19. The integrated circuit of claim 17, wherein the first and second active regions are disposed in a first active area extending in a first direction, and the third active region is disposed in a second active area extending in the first direction;

wherein the first and second active areas are separated from each other in a second direction different from the first direction.

20. The integrated circuit of claim 19, further comprising:

a conductive line extending in the second direction to couple the second active region to the third active region.

* * * * *